US012738204B2

(12) United States Patent
Jo et al.

(10) Patent No.: US 12,738,204 B2
(45) Date of Patent: Sep. 15, 2026

(54) DISPLAY DEVICE

(71) Applicant: SAMSUNG DISPLAY CO., LTD., Yongin-si (KR)

(72) Inventors: Kang Moon Jo, Yongin-si (KR); Sun Kwang Kim, Yongin-si (KR); Dong Yoon Lee, Yongin-si (KR); Seong Young Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/083,521

(22) Filed: Mar. 19, 2025

(65) Prior Publication Data

US 2025/0384817 A1 Dec. 18, 2025

(30) Foreign Application Priority Data

Jun. 17, 2024 (KR) ........................ 10-2024-0078292

(51) Int. Cl.
*G09G 3/32* (2016.01)
*G09G 3/3266* (2016.01)
(Continued)

(52) U.S. Cl.
CPC ............. *G09G 3/32* (2013.01); *G09G 3/3266* (2013.01); *H10H 29/37* (2025.01); *H10H 29/49* (2025.01); *H10H 29/8517* (2025.01); *H10H 29/852* (2025.01); *H10K 59/122* (2023.02); *H10K 59/131* (2023.02); *H10K 59/38* (2023.02);
(Continued)

(58) Field of Classification Search
CPC ... G09G 3/32–3291; G09G 2310/0267; G09G 2330/06; H10K 59/122; H10K 59/131; H10K 59/38; H10K 59/871; H10K 59/873; H10K 59/88
See application file for complete search history.

(56) References Cited

U.S. PATENT DOCUMENTS 11,557,644 B2 * 1/2023 Kim ..................... H10K 59/131
11,982,893 B2 * 5/2024 Kawai ............... G02F 1/133388
(Continued)

FOREIGN PATENT DOCUMENTS

KR 10-2016-0112161 A 9/2016
KR 10-2021-0038517 A 4/2021
(Continued)

*Primary Examiner* — Gene W Lee
(74) *Attorney, Agent, or Firm* — F. CHAU & ASSOCIATES, LLC

(57) ABSTRACT

A display device includes a display area including first to third pixels respectively emitting lights having different colors. A display transmissive area is on a side of the pixels. A first non-display area is on a first side of the display area. The first non-display area includes a scan line area including a plurality of lines extending in a first direction and spaced apart from each other in a second direction. A scan circuit is between the scan line area and the display area, and receives a signal from the lines to provide a scan signal to the display area. An anti-electrostatic element is at an outermost portion of the first non-display area. A non-display transmissive area is between the scan line area and the anti-electrostatic element to transmit light. A planar area of the non-display transmissive area is greater than a planar area of the scan circuit.

11 Claims, 10 Drawing Sheets

(51) Int. Cl.

| | |
|---|---|
| ***H10H 29/37*** | (2025.01) |
| ***H10H 29/49*** | (2025.01) |
| ***H10H 29/85*** | (2025.01) |
| ***H10H 29/852*** | (2025.01) |
| ***H10K 59/122*** | (2023.01) |
| ***H10K 59/131*** | (2023.01) |
| ***H10K 59/38*** | (2023.01) |
| ***H10K 59/80*** | (2023.01) |
| ***H10K 59/88*** | (2023.01) |

(52) U.S. Cl.
CPC ......... *H10K 59/871* (2023.02); *H10K 59/873* (2023.02); *H10K 59/88* (2023.02); *G09G 2310/0267* (2013.01); *G09G 2330/06* (2013.01)

(56) References Cited

U.S. PATENT DOCUMENTS

| | | | | |
|---|---|---|---|---|
| 2024/0077775 | A1* | 3/2024 | Kawai | G02F 1/1345 |
| 2025/0081756 | A1 | 3/2025 | Kim et al. | |
| 2025/0143134 | A1 | 5/2025 | Kim et al. | |

FOREIGN PATENT DOCUMENTS

| | | | | | |
|---|---|---|---|---|---|
| KR | 10-2021-0085129 | A | | 7/2021 | |
| KR | 10-2025-0036311 | A | | 3/2025 | |
| KR | 10-2025-0064125 | A | | 5/2025 | |
| TW | 202123458 | A | * | 6/2021 | H10K 59/87 |

* cited by examiner

PD: PD1, PD2, PD3, PD4, PD5

DISPLAY DEVICE

CROSS-REFERENCE TO RELATED APPLICATION

This application claims priority under 35 U.S.C. § 119 to Korean Patent Application No. 10-2024-0078292, filed on Jun. 17, 2024 in the Korean Intellectual Property Office, the disclosure of which is incorporated by reference in its entirety herein.

1. TECHNICAL FIELD

Embodiments of the present disclosure relate to a display device.

2. DISCUSSION OF RELATED ART

Display devices are being applied to an increasing variety of electronic devices along with the advancement of the information society. For example, display devices are being applied to electronic devices, such as smart phones, digital cameras, laptop computers, navigation devices, and smart televisions. A display device may include a display panel having pixels that are self emissive. Therefore, the pixels of the display panel can emit light by themselves without requiring a backlight for supplying light to the display panel.

The display device includes a plurality of pixels, data lines and scan lines connected to the plurality of pixels, a data driver that applies data voltages to the data lines, and a scan driver that provides scan signals to the scan lines.

SUMMARY

At least one embodiment of the present disclosure provides a display device with a transparent display panel by making a non-display area less noticeable.

According to an embodiment of the present disclosure, a display device includes a display area comprising first to third pixels respectively emitting light having different colors from each other. A display transmissive area is located on a side of the first to third pixels. A first non-display area is located on a first side of the display area. The first non-display area comprises a scan line area comprising a plurality of lines extending in a first direction and spaced apart from each other in a second direction intersecting the first direction. A scan circuit is disposed between the scan line area and the display area. The scan circuit receives a signal from the plurality of lines and provides a scan signal to the display area. An anti-electrostatic element is disposed at an outermost portion of the first non-display area. A non-display transmissive area is located between the scan line area and the anti-electrostatic element to transmit light. An area of the non-display transmissive area in a plan view is greater than an area of the scan circuit in the plan view.

In an embodiment, the non-display transmissive area may not include a metal layer, a transistor, a signal line, or a voltage line.

In an embodiment, the plurality of lines include a clock line disposed adjacent to the non-display transmissive area. The clock line provides a clock signal to the scan circuit. A carry line is disposed adjacent to the scan circuit. The carry line provides a carry signal to the scan circuit. A scan input line is disposed between the clock line and the carry line. The scan input line provides a scan input signal to the scan circuit.

In an embodiment, the first to third pixels are adjacent to each other in the first direction, and the display transmissive area is located on a first side of the first to third pixels in the second direction.

In an embodiment, the display device may further include a low-level voltage line overlapping with the scan circuit and extending in the first direction, and a bridge contact overlapping with the low-level voltage line. Each of the first to third pixels may include a pixel electrode, an emissive layer and a common electrode. The common electrode may extend to the first non-display area beyond the display area and is in direct contact with the low-level voltage line at the bridge contact.

In an embodiment, the display device may further include a substrate defining the display area and the first non-display area, a light-emitting element layer disposed on the substrate and including a pixel circuit and a light-emitting element of each of the first to third pixels, an encapsulation layer disposed on the light-emitting element layer, an opposing substrate facing the substrate, a color filter layer disposed on a surface of the opposing substrate facing the substrate and including first to third color filters associated with the first to third pixels, respectively, a wavelength conversion layer disposed on a surface of the color filter layer and including first to third transparent members associated with the first to third color filters, respectively, a filling layer disposed between the encapsulation layer and the wavelength conversion layer and filling space therebetween, and a sealing member disposed along an edge of the first non-display area. The sealing member may attach the substrate to the opposing substrate.

In an embodiment, the display device may further include a compensation layer disposed at an edge of the surface of the opposing substrate and overlapping with the low-level voltage line, the scan line area and the non-display transmissive area.

In an embodiment, the display device may further include a bank disposed on the surface of the color filter layer and defining the first to third transparent members. First to third dummy pixels are defined by the bank. The first to third dummy pixels overlap with the scan circuit, and have a same shape as the first to third pixels in the plan view.

In an embodiment, the first to third dummy pixels may include the first to third color filters and the first to third transparent members, respectively, and may not include a light-emitting element.

In an embodiment, the display device may further include a second non-display area adjacent to the first non-display area, a third non-display area located at a position opposite to the second non-display area, and a fourth non-display area located at a position opposite to the first non-display area. The low-level voltage line and the anti-electrostatic element may be disposed along the first to fourth non-display areas and surround the display area in the plan view and are spaced apart from the display area.

According to an embodiment of the present disclosure, a display device includes a display area including first to third pixels respectively emitting lights having different colors from each other, and a display transmissive area located on a side of the first to third pixels. A first non-display area is located on a first side of the display area in a first direction and including a scan driver providing scan signals to the first to third pixels. A second non-display area is adjacent to the first non-display area and located on a second side of the display area in a second direction intersecting the first direction. The second non-display area include a first non-display transmissive area adjacent to the display area and transmitting light, a first low-level voltage line disposed on an upper side of the first non-display transmissive area in the second direction and providing a low-level voltage, a second non-display transmissive area disposed on an upper side of the first low-level voltage line in the second direction and transmitting light, a second low-level voltage line disposed in an underlying layer of the first low-level voltage line on an upper side of the second non-display transmissive area in the second direction and providing a low-level voltage, a third non-display transmissive area disposed on an upper side of the second low-level voltage line in the second direction and transmitting light, and an anti-electrostatic element disposed at an outermost portion of the second non-display area.

In an embodiment, an area of the second non-display transmissive area in a plan view may be greater than an area of the first non-display transmissive area in the plan view. An area of the third non-display transmissive area in the plan view may be greater than the area of the second non-display transmissive area in the plan view.

In an embodiment, the display device may further include a voltage connection line extending from the display area to the first low-level voltage line and surrounding a portion of the first non-display transmissive area in a plan view.

In an embodiment, the display device may further include a bridge contact overlapping the first low-level voltage line. Each of the first to third pixels may include a pixel electrode, an emissive layer, and a common electrode. The common electrode may extend to the second non-display area beyond the display area and may be in direct contact with the first low-level voltage line at the bridge contact.

In an embodiment, the display device may further include a substrate defining the display area and the first and second non-display areas, a light-emitting element layer disposed on the substrate and including a pixel circuit and a light-emitting element of each of the first to third pixels, an encapsulation layer disposed on the light-emitting element layer, an opposing substrate facing the substrate, a color filter layer disposed on a surface of the opposing substrate facing the substrate and including first to third color filters associated with the first to third pixels, respectively, a wavelength conversion layer disposed on a surface of the color filter layer and including first to third transparent members associated with the first to third color filters, respectively, a filling layer disposed between the encapsulation layer and the wavelength conversion layer and filling space therebetween, and a sealing member disposed along an edge of the non-display area. The sealing member attaching the substrate to the opposing substrate.

In an embodiment, the pixel circuit may include a bottom metal layer disposed on the substrate, a semiconductor layer disposed on the bottom metal layer, a gate layer disposed on the semiconductor layer, and a source metal layer disposed on the gate layer. The first low-level voltage line may be disposed in a same layer as the pixel electrode and may include a plurality of holes. The second low-level voltage line may be disposed in the source metal layer.

In an embodiment, the display device may further include a voltage connection line extending from the second low-level voltage line to the anti-electrostatic element and surrounding a portion of the third non-display transmissive area in a plan view. The anti-electrostatic element may be disposed in the bottom metal layer and the gate layer.

According to an embodiment of the present disclosure, a display device includes a display area including first to third pixels respectively emitting lights having different colors from each other, and a display transmissive area located on a side of the first to third pixels. A first non-display area is located on a first side of the display area in a first direction and including a scan driver providing scan signals to the first to third pixels. A second non-display area is adjacent to the first non-display area and located on a second side of the display area in a second direction intersecting the first direction. A third non-display area is opposite to the second non-display area. A substrate defines the display area and the first to third non-display areas. A light-emitting element layer is disposed on the substrate and including a pixel circuit and a light-emitting element of each of the first to third pixels. An encapsulation layer is disposed on the light-emitting element layer. An opposing substrate faces the substrate. A color filter layer is disposed on a surface of the opposing substrate facing the substrate and includes first to third color filters associated with the first to third pixels, respectively. A wavelength conversion layer is disposed on a surface of the color filter layer and including first to third transparent members associated with the first to third color filters, respectively. A bank is disposed on the surface of the color filter layer to define the first to third transparent members. The third non-display area includes first to third dummy pixels defined by the bank. The first to third dummy pixels having a same shape as the first to third pixels in a plan view. The first to third dummy pixels is adjacent to each other in the second direction. A non-display transmissive area overlaps with the first and second dummy pixels. A low-level voltage line overlaps with the second and third dummy pixels. The low-level voltage line extends in the first direction, and includes a plurality of holes.

In an embodiment, the first to third dummy pixels may include the first to third color filters and the first to third transparent members, respectively. The first to third dummy pixels may not include a light-emitting element.

In an embodiment, the low-level voltage line may extend to edges of the first and second non-display areas.

According to an embodiment of the present disclosure, an electronic device includes a display device. A power supply provides power to the display device. The display device comprises a display area comprising a plurality of pixels respectively emitting light having different colors from each other, and a display transmissive area located on a side of the plurality of pixels. A first non-display area is located on a first side of the display area. The first non-display area comprises a scan line area comprising a plurality of lines extending in a first direction and spaced apart from each other in a second direction intersecting the first direction. A scan circuit is disposed between the scan line area and the display area. The scan circuit receives a signal from the plurality of lines and providing a scan signal to the display area. An anti-electrostatic element is disposed at an outermost portion of the first non-display area. A non-display transmissive area is located between the scan line area and the anti-electrostatic element to transmit light. An area of the non-display transmissive area in a plan view is greater than an area of the scan circuit in the plan view.

In an embodiment, the non-display transmissive area does not comprise a metal layer, a transistor, a signal line, or a voltage line.

In an embodiment, the plurality of lines comprises a clock line disposed adjacent to the non-display transmissive area, the clock line providing a clock signal to the scan circuit. A carry line is disposed adjacent to the scan circuit. The carry line provides a carry signal to the scan circuit. A scan input line is disposed between the clock line and the carry line. The scan input line provides a scan input signal to the scan circuit.

In an embodiment, the plurality of pixels is spaced apart from each other in the first direction. The display transmissive area is located on a first side of the plurality of pixels in the second direction.

In an embodiment, a low-level voltage line overlaps with the scan circuit and extends in the first direction. A bridge contact overlaps with the low-level voltage line. Each of the plurality of pixels comprises a pixel electrode, an emissive layer and a common electrode. The common electrode extends to the first non-display area beyond the display area and is in direct contact with the low-level voltage line at the bridge contact.

In an embodiment, a second non-display area is adjacent to the first non-display area. A third non-display area is located at a position opposite to the second non-display area. A fourth non-display area is located at a position opposite to the first non-display area. The low-level voltage line and the anti-electrostatic element are disposed along the first to fourth non-display areas and surround the display area in the plan view and are spaced apart from the display area.

According to an embodiment of the present disclosure, a display device includes a non-display transmissive area that is located in a non-display area and has a predetermined area, so that a high-density metal pattern is avoided in the non-display area and a transparent display panel can be implemented.

BRIEF DESCRIPTION OF THE DRAWINGS

The above and other features of the present disclosure will become more apparent by describing in detail non-limiting embodiments thereof, with reference to the accompanying drawings, in which.

DETAILED DESCRIPTION OF EMBODIMENTS

Figure 1:
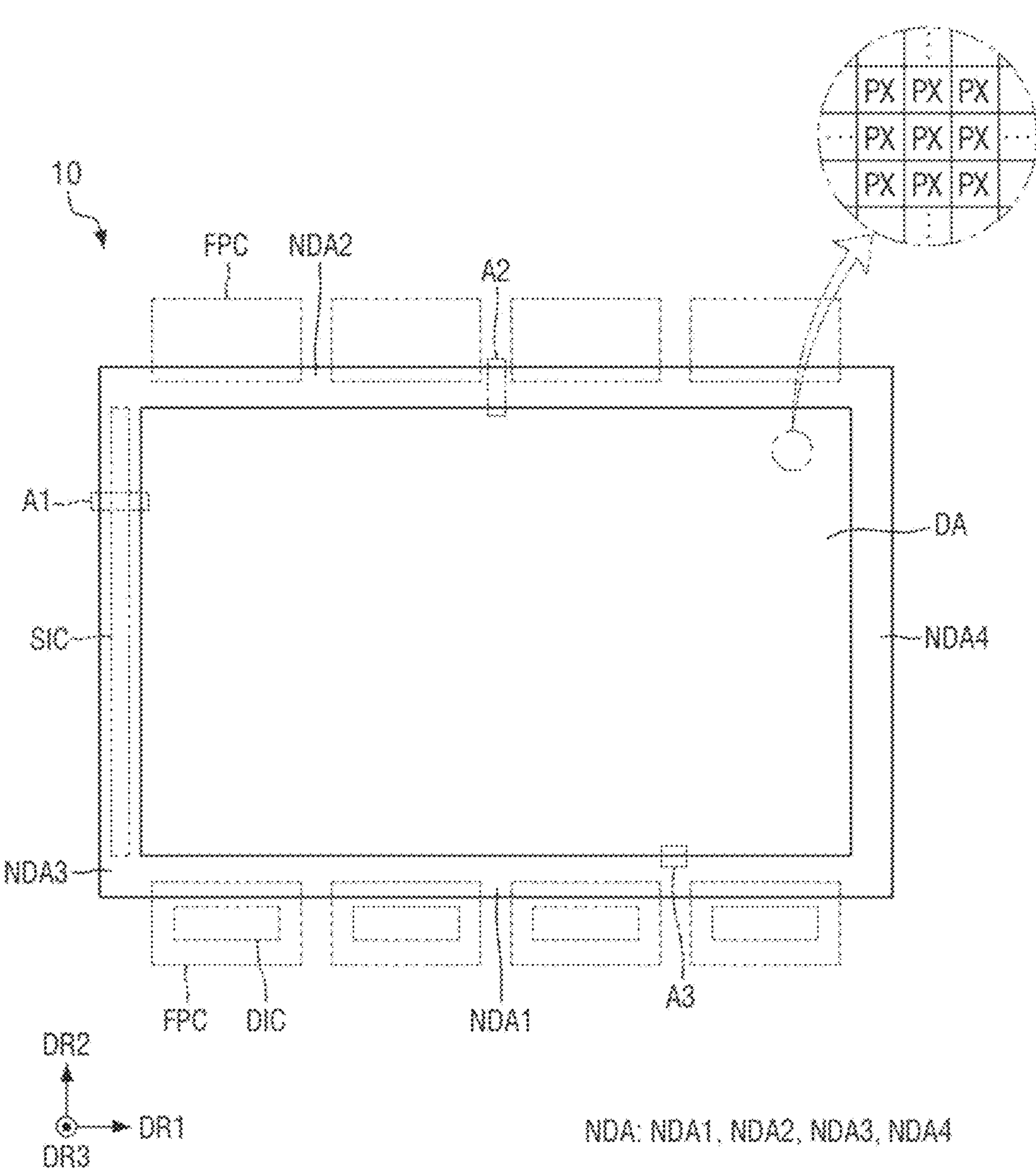
FIG. 1 is a plan view showing a display device according to an embodiment of the present disclosure.

Embodiments of the present disclosure will be described more fully hereinafter with reference to the accompanying drawings. Like reference numerals may refer to like elements throughout the specification and the accompanying drawings.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationship between components should be interpreted in a like fashion.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. When a film, a region, a layer, or an element, is referred to as being "directly on", "directly connected to", "directly coupled to", or "directly adjacent to" another component, no intervening components may be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each embodiment are available for other similar features or aspects in other embodiments, unless the context clearly indicates otherwise. Accordingly, all features and structures described herein may be mixed and matched in any desirable manner.

As used herein, the singular forms "a", "an" and "the" are intended to include the plural forms as well, unless the context clearly indicates otherwise.

When a feature is said to extend, protrude, or otherwise follow a certain direction, it will be understood that the feature may follow said direction in the negative, such as the opposite direction. Accordingly, the feature is not necessarily limited to follow exactly one direction, and may follow along an axis formed by the direction, unless the context clearly indicates otherwise.

Hereinafter, embodiments of the present disclosure will be described in detail with reference to the accompanying drawings.

A display device includes a display area having a display transmissive area that is transmissive to light and a non-display area having at least one non-display transmissive area that is transmissive to light. The non-display transmissive area may have an area in a plan view that is greater than areas of adjacent areas, such as a scan circuit, an anti-electrostatic element, etc. Thus, it is possible to avoid a high-density metal pattern in the non-display area and the non-display area may be less noticeable to the user. Therefore, a transparent display panel can be implemented.

The display device having a non-display area including a plurality of non-display transmissive areas may have respective areas of the non-display transmissive areas in a plan view that increase towards an outer portion of the non-display area.

FIG. 1 is a plan view showing a display device according to an embodiment of the present disclosure.

Referring to FIG. 1, a display device 10 is for displaying at least one moving image and/or still image. In an embodiment, the display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things. However, embodiments of the present disclosure are not necessarily limited thereto and the display device DD may be applied to various different small-sized, medium-sized or large-sized electronic devices. The electronic device may include a power supply that provides power for operations of the electronic device.

In an embodiment, the display device 10 may have a rectangular shape having longer sides in a first direction DR1 and shorter sides in a second direction DR2 intersecting the first direction DR1 when viewed from the top. Each of the corners where the longer side in the first direction DR1 meets the shorter side in the second direction DR2 may be rounded with a predetermined curvature or may be a right angle. However, the shape of the display device 10 when viewed from the top (e.g., a planar shape) is not necessarily limited to a quadrangular shape, but may be formed in another polygonal shape, circular shape, or elliptical shape. The display device 10 may be formed flat. However, embodiments of the present disclosure are not necessarily limited thereto. For example, the display device 10 may include curved portions that are formed at left and right ends and have a constant curvature or varying curvatures. In some embodiments, the display device 10 may be flexible so that it can be curved, bent, folded or rolled.

The display device 10 may include a display area DA where images are displayed, and a non-display area NDA disposed around the display area DA (e.g., in a plan view). The display area DA may occupy most of the area of the display device 10. The display area DA may be disposed in the center portion of display device 10. The display area DA may include a plurality of pixels PX for displaying images.

Each of the plurality of pixels PX may include a light-emitting element that emits light. In an embodiment, the light-emitting element may include, but is not necessarily limited to, at least one of: an organic light-emitting diode including an organic emissive layer, a quantum-dot light-emitting diode including a quantum-dot emissive layer, an inorganic light-emitting diode including an inorganic semiconductor, and a micro light-emitting diode (micro LED).

The non-display area NDA may be disposed adjacent to the display area DA (e.g., in the first and/or second directions DR1, DR2). The non-display area NDA may be located on the outer side of the display area DA. The non-display area NDA may surround the display area DA (e.g., fully surround the display area DA in a plan view). The non-display area NDA may be defined as the edge area of the display device 10. In an embodiment, the non-display area NDA may include first to fourth non-display area NDA1, NDA2, NDA3 and NDA4. The first non-display area NDA1 may be located on the lower side of the display area DA (e.g., in a direction opposite to the second direction DR2), the second non-display area NDA2 may be located on the upper side of the display area DA (e.g., in the second direction DR2), the third non-display area NDA3 may be located on the left side of the display area DA (e.g., in a direction opposite to the first direction DR1), and the fourth non-display area NDA4 may be located on the right side of the display area DA (e.g., in the first direction DR1).

The non-display area NDA may include a scan driver SIC, fan-out lines, and pads. The scan driver SIC may provide scan signals to scan lines in the display area DA. The fan-out lines may electrically connect the display driver DIC with data lines in the display area DA. The pads may be electrically connected to flexible films FPC. For example, the pads may be disposed at one edge of the display device 10, and the scan driver SIC may be disposed at another edge adjacent to the edge of the display device 10 (e.g., a left edge in the direction opposite to the first direction DR1). It should be understood, however, that embodiments of the present disclosure are not necessarily limited thereto.

The display driver DIC may output signals and voltages for driving the display device 10. The display driver DIC may apply data voltages to the data lines. The display driver DIC may apply a supply voltage to a supply voltage line, and may supply a scan control signal to the scan driver SIC. For example, in an embodiment the display driver DIC may be implemented as an integrated circuit (IC) and mounted on the flexible films FPC by the chip-on-film (COF) technique. Alternatively, the display driver DIC may be mounted in the non-display area NDA of the display device 10 by chip-on-glass (COG) technique, chip-on-plastic (COP) technique, or ultrasonic bonding.

Figure 2:
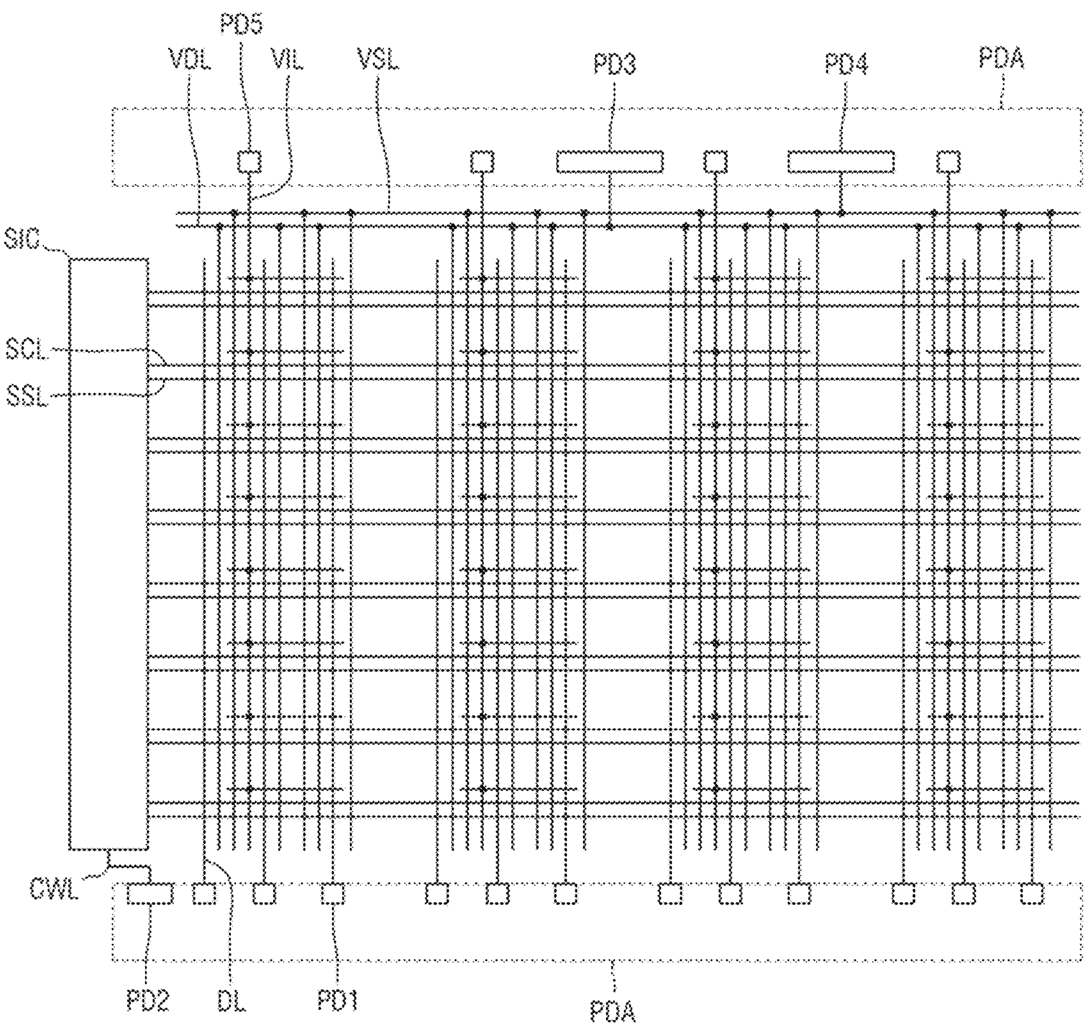
FIG. 2 is a view showing the arrangement of lines of a display device according to an embodiment of the present disclosure.
Figure 2:
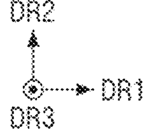

FIG. 2 is a view showing the arrangement of lines of a display device according to an embodiment of the present disclosure.

Referring to FIG. 2, the display device 10 may include a scan line SCL, a sensing line SSL, a data line DL, an initialization voltage line VIL, a first voltage line VDL, and a second voltage line VSL.

The data line DL may be extended in the second direction DR2 intersecting the first direction DR1. The data line DL may be extended from a first pad PD1 to the display area DA. The data line DL may provide the data voltage received from the first pad PD1 to the pixels PX.

The scan line SCL and the sensing line SSL may extend longitudinally in the first direction DR1. The scan line SCL and the sensing line SSL may extend from the scan driver SIC to the display area DA. The scan line SCL may provide (e.g., send) a scan signal to the pixels PX, and the sensing line SSL may provide a sensing signal to the pixels PX. The scan driver SIC may include a scan input line and a scan driver circuit. In an embodiment, the scan driver SIC may be disposed in the third non-display area NDA3, but embodiments of the present disclosure are not necessarily limited thereto. The scan driver SIC may be connected to a signal connection line CWL. The signal connection line CWL may provide a clock signal received from a second pad PD2 and a scan input signal to the scan driver SIC.

The first voltage line VDL may include a first portion extending longitudinally in the first direction DR1 and a second portion extending longitudinally in the second direction DR2. The first voltage line VDL may be a high-level voltage line. The first voltage line VDL may provide a high-level voltage received from a third pad PD3 to the pixels PX.

The second voltage line VSL may include a first portion extending longitudinally in the first direction DR1 and a second portion extending longitudinally in the second direction DR2. The second voltage line VSL may be a low-level voltage line. The second voltage line VSL may provide a low-level voltage received from a fourth pad PD4 to the pixels PX.

The initialization voltage line VIL may include a first portion extending longitudinally in the first direction DR1 and a second portion extending longitudinally in the second direction DR2. The initialization voltage line VIL may provide an initialization voltage received from a fifth pad PD5 to the pixels PX.

In an embodiment, the first and second pads PD1 and PD2 may be disposed in the first non-display area NDA1 and electrically connected to the flexible films FPC. The first pad PD1 may receive a data voltage from the display driver DIC mounted on the flexible film FPC, and the second pad PD2 may receive a clock signal and a scan input signal from the flexible film FPC.

The third to fifth pad portions PD3, PD4 and PD5 may be disposed in the second non-display area NDA2 and electrically connected to the flexible films FPC. In an embodiment, the third pad PD3 may receive a high-level voltage from a power supply electrically connected to the flexible film FPC, the fourth pad PD4 may receive a low-level voltage from the power supply, and the fifth pad PD5 may receive an initialization voltage from the power supply.

Figure 3:
FIG. 3 is a circuit diagram showing a pixel of a display device according to an embodiment of the present disclosure.
Figure 3:
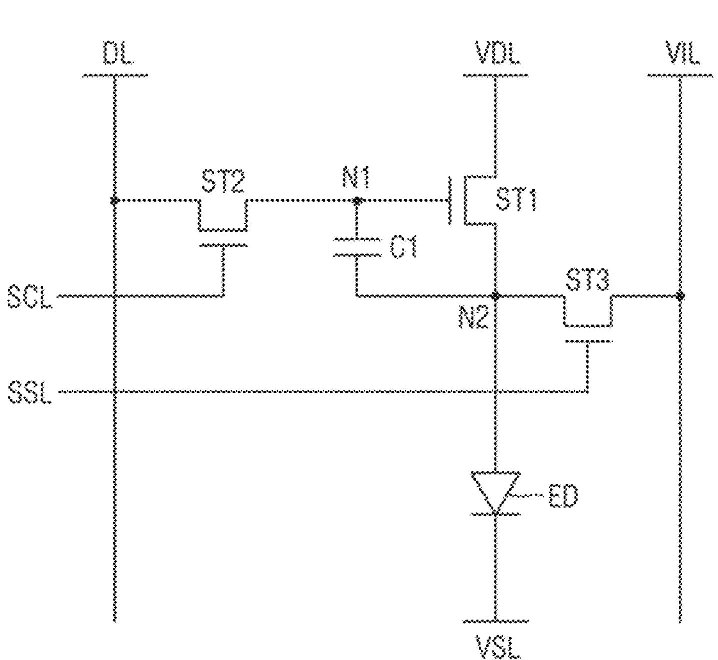

FIG. 3 is a circuit diagram showing a pixel of a display device according to an embodiment of the present disclosure.

Referring to FIG. 3, a pixel PX may be connected to a first voltage line VDL, a data line DL, an initialization voltage line VIL, a scan line SCL, a sensing line SSL and a second voltage line VSL. The pixel PX may include first to third transistors ST1, ST2 and ST3, a capacitor C1, and a light-emitting element ED.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. In an embodiment, the first transistor ST1 may control a drain-source current (e.g., a driving current) based on a data voltage applied to the gate electrode.

The light-emitting element ED may receive the driving current to emit light. The amount or the brightness of the light emitted from the light-emitting element ED may be proportional to the magnitude of the driving current. In an embodiment, the light-emitting element ED may be an organic light-emitting diode including an organic light-emitting layer, a quantum-dot LED including a quantum-dot light-emitting layer, a micro LED, or an inorganic LED including an inorganic semiconductor. The first electrode of the light-emitting element ED may be connected to the second node N2, and a second electrode of the light-emitting element ED may be connected to the second voltage line VSL. The second electrode of the light-emitting element ED may receive a low-level voltage on the second voltage line VSL.

In an embodiment, the second transistor ST2 may be turned on by a scan signal from the scan line SCL to electrically connect the data line DL with the first node N1, which is the gate electrode of the first transistor ST1. The second transistor ST2 may be turned on in response to the scan signal to apply data voltage to the first node N1. The gate electrode of the second transistor ST2 may be connected to the scan line SCL, the drain electrode may be connected to the data line DL, and the source electrode may be connected to the first node N1.

The third transistor ST3 may be turned on by the sensing signal of the sensing line SSL to electrically connect the initialization voltage line VIL with the second node N2, which is the source electrode of the first transistor ST1. In an embodiment, the third transistor ST3 may be turned on in response to the sensing signal to apply the initialization voltage to the second node N2. The third transistor ST3 may be turned on in response to the sensing signal to provide the sensing signal to the initialization voltage line VIL.

The capacitor C1 may be connected between the first node N1 and the second node N2. The first capacitor C1 may hold a potential difference between the first node N1 and the second node N2.

Figure 4:
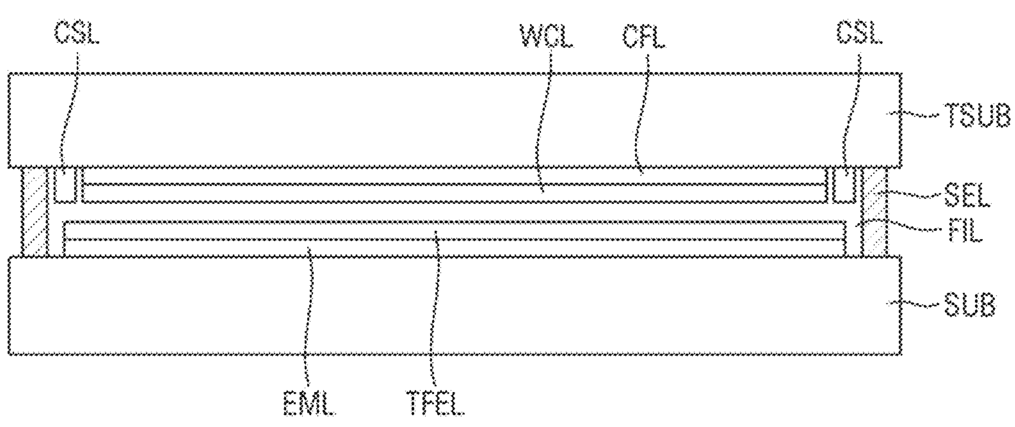
FIG. 4 is a cross-sectional view showing a display device according to an embodiment of the present disclosure.
Figure 4:
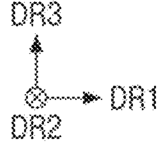

FIG. 4 is a cross-sectional view showing a display device according to an embodiment of the present disclosure.

Referring to FIG. 4, in an embodiment the display device 10 may include a substrate SUB, an emission material layer EML, an encapsulation layer TFEL, a filling layer FIL, a wavelength conversion layer WCL, a color filter layer CFL, a compensation layer CSL, an opposing substrate TSUB and a sealing member SEL.

The substrate SUB may be a base substrate or a base member. The substrate SUB may be a rigid substrate. The substrate SUB may include a transparent insulating material. For example, in an embodiment the substrate SUB may include, but is not necessarily limited to, a glass material or a metal material. For another example, the substrate SUB may be a flexible substrate that can be bent, folded, or rolled. The substrate SUB may include a polymer resin such as polyimide PI.

The emission material layer EML may be disposed on the substrate SUB. The emission material layer EML may include a pixel circuit and a light-emitting element ED. The pixel circuit may include a plurality of transistors to drive a light-emitting element ED, and the light-emitting element ED can emit light. In an embodiment, the emission material layer EML may include a scan line SCL, a sensing line SSL, a data line DL, an initialization voltage line VIL, a first voltage line VDL, and a second voltage line VSL. Each of the transistors may include a semiconductor region, a source electrode, a drain electrode, and a gate electrode. The scan driver SIC may be formed on a side of the non-display area NDA and may include a plurality of transistors.

The encapsulation layer TFEL may be disposed on the emission material layer EML. The encapsulation layer TFEL may include at least one inorganic layer to prevent permeation of oxygen or moisture into the light-emitting element ED. The encapsulation layer TFEL may include at least one organic film to protect the light-emitting element ED from particles such as dust.

The opposing substrate TSUB may be opposed to the substrate SUB (e.g., in the third direction DR3). The opposing substrate TSUB may encapsulate the emission material layer EML together with the substrate SUB. The opposing substrate TSUB may include a transparent material. For example, in an embodiment the opposing substrate TSUB may include a transparent insulating material such as glass and quartz, and can transmit light emitted from the emission material layer EML.

The color filter layer CFL may be disposed on a surface of the opposing substrate TSUB that faces the substrate SUB. The color filter layer CFL may include a plurality of color filters. In an embodiment, each of the color filters may selectively transmit light of a particular wavelength and block or absorb lights of other wavelengths. The color filter layer CFL may absorb some of lights introduced from the outside of the display device 10 to reduce the reflection of external light. The color filter layer CFL can increase the color characteristics of light emitted through the wavelength conversion layer WCL.

The wavelength conversion layer WCL may be disposed on a surface of the color filter layer CFL that faces the substrate SUB. In an embodiment, the wavelength conversion layer WCL may convert the wavelength of light emitted from the emission material layer EML to emit red light, green light and blue light. However, embodiments of the present disclosure are not necessarily limited thereto and the colors of the light that the wavelength conversion layer WCL converts light to may vary.

The compensation layer CSL may be disposed on a surface of the opposing substrate TSUB that faces the substrate SUB. In an embodiment, the compensation layer CSL may be disposed at the edge of the opposing substrate TSUB and surround the color filter layer CFL and the wavelength conversion layer WCL. In an embodiment, the compensation layer CSL may be disposed at the edge of the opposing substrate TSUB where the color filter layer CFL and the wavelength conversion layer WCL are not disposed to reduce the level difference, thereby stabilizing the structure of the display device 10. The compensation layer CSL may include at least one organic layer, but the constituent material of the compensation layer CSL is not necessarily limited thereto.

The filling layer FIL may be disposed between the substrate SUB and the opposing substrate TSUB (e.g., in the third direction DR3). The filling layer FIL may be used to fill between the substrate SUB and the opposing substrate TSUB to protect the display area of the display device 10.

The sealing member SEL may couple the substrate SUB with the opposing substrate TSUB. The sealing member SEL may seal the emission material layer EML by coupling the substrate SUB with the opposing substrate TSUB. The sealing member SEL may be disposed along the edge of the non-display area NDA and may surround the display area DA.

Figure 5:
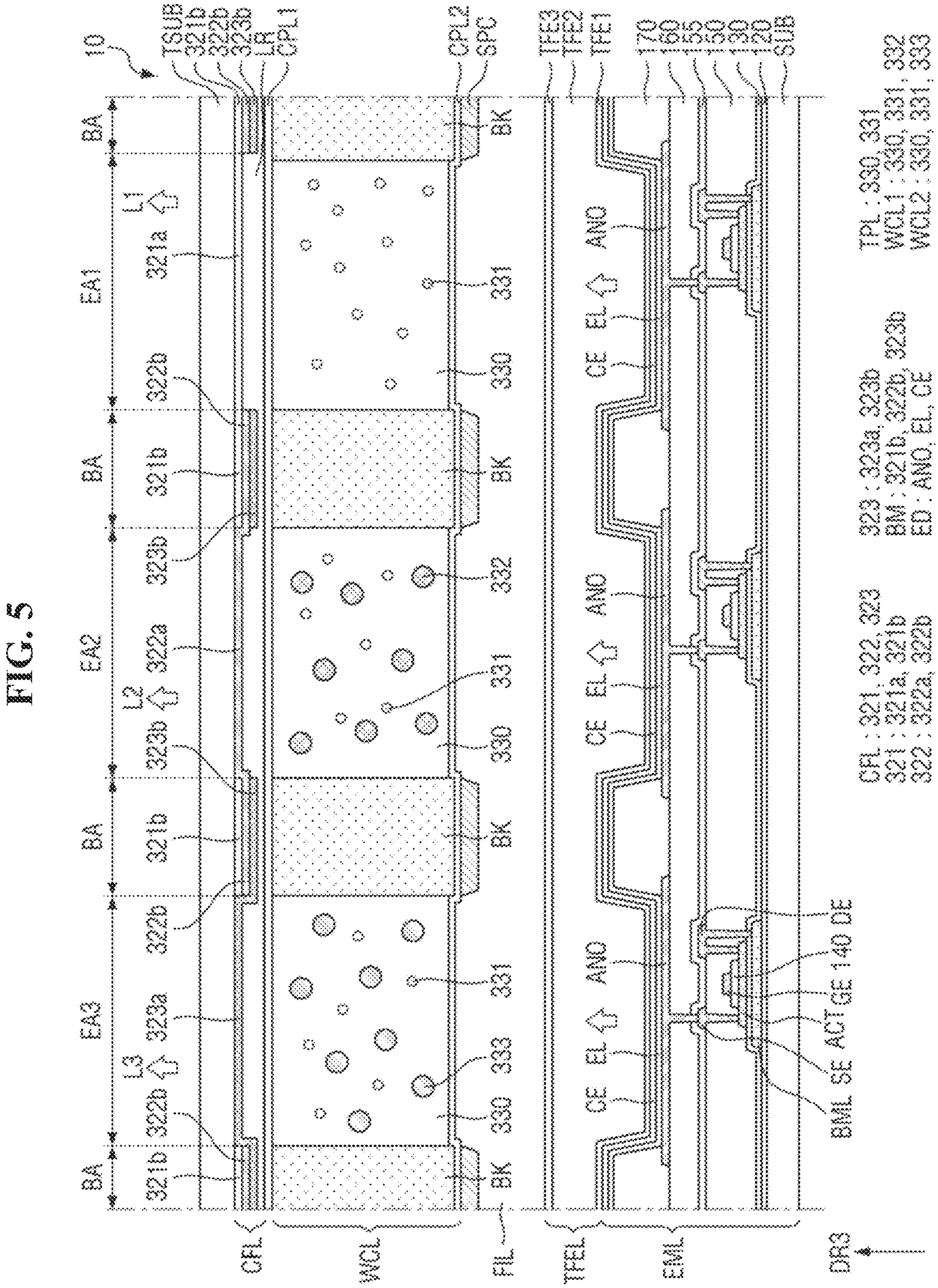
FIG. 5 is a cross-sectional view showing in detail a display device according to an embodiment of the present disclosure.

FIG. 5 is a cross-sectional view showing in detail a display device according to an embodiment of the present disclosure.

Referring to FIG. 5, the emission material layer EML may be disposed on the substrate SUB. In an embodiment, the emission material layer EML may include a buffer layer 120, a bottom metal layer BML, a first insulating layer 130, a semiconductor layer ACT, a gate insulator 140, a gate electrode GE, a second insulating layer 150, a drain electrode DE, a source electrode SE, a third insulating layer 155, a fourth insulating layer 160, a light-emitting element ED, and a pixel-defining layer 170.

The buffer layer 120 may be disposed on the substrate SUB (e.g., disposed directly thereon in the third direction DR3). The buffer layer 120 may include an inorganic material that can prevent the permeation of air or moisture. For example, in an embodiment the buffer layer 120 may include a plurality of inorganic films stacked on one another alternately (e.g., in the third direction DR3).

The bottom metal layer BML may be disposed on the buffer layer 120 (e.g., disposed directly thereon in the third direction DR3). The bottom metal layer BML can block external light from being introduced into the semiconductor layer ACT. The bottom metal layer BML can block light and can reduce leakage current occurring in the transistors.

The first insulating layer 130 may be disposed over the bottom metal layer BML. The first insulating layer 130 may insulate the bottom metal layer BML from the semiconductor layer ACT. The first insulating layer 130 may include an inorganic insulating material.

The semiconductor layer ACT may be disposed on the first insulating layer 130 (e.g., disposed directly thereon in the third direction DR3). The semiconductor layer ACT may include the semiconductor region of a transistor. The semiconductor layer ACT may overlap with the bottom metal layer BML (e.g., in the third direction DR3), and the bottom metal layer BML can suppress generation of photocurrent in the semiconductor layer ACT.

The semiconductor layer ACT may include an oxide semiconductor. For example, in an embodiment the semiconductor layer ACT may be made of, but is not necessarily limited to, Zn oxide, In—Zn oxide, Ga—In—Zn oxide, etc., as a Zn oxide-based material, and may be an IGZO (In—Ga—Zn—O) semiconductor containing a metal such as indium (In) and gallium (Ga) in ZnO. For another example, the semiconductor layer ACT may include amorphous silicon or polysilicon.

The gate insulator 140 may be disposed between the semiconductor layer ACT and the gate electrode GE (e.g., in the third direction DR3) to insulate the semiconductor layer ACT from the gate electrode GE. For example, in an embodiment the gate insulator 140 may composed of multiple layers and may have a partially patterned shape. The area of the gate insulator 140 may be less than the area of the semiconductor layer ACT and larger than the area of the gate electrode GE, but embodiments of the present disclosure are not necessarily limited thereto. The gate insulator 140 may include an inorganic insulating material.

The gate electrode GE may be disposed on the gate insulator 140 (e.g., disposed directly thereon in the third direction DR3). The gate electrode GE may overlap with the semiconductor layer ACT (e.g., in the third direction DR3). For example, the gate electrode GE may receive a scan signal from the scan line SCL or a sensing signal from the sensing line SSL.

The second insulating layer 150 may be disposed on the gate electrode GE and cover the semiconductor layer ACT and the gate electrode GE. The second insulating layer 150 may have a flat top surface. For example, the second insulating layer 150 may include an organic insulating material or an inorganic insulating material.

The drain electrode DE and the source electrode SE may be spaced apart from each other on the second insulating layer 150. In an embodiment, the drain electrode DE and the source electrode SE may be connected to (e.g., directly connected thereto) the semiconductor layer ACT through contact holes penetrating the second insulating layer 150, respectively. The drain electrode DE may penetrate the second insulating layer 150 and the first insulating layer 130 to be connected to the bottom metal layer BML.

The third insulating layer 155 may be disposed on the drain electrode DE and the source electrode SE to cover the transistor. For example, the third insulating layer 155 may be a passivation layer. In an embodiment, the third insulating layer 155 may include an inorganic insulating material.

The fourth insulating layer 160 may be disposed on the third insulating layer 155 to cover the third insulating layer 155. For example, the fourth insulating layer 160 may include an organic insulating material and may have a flat upper surface.

The light-emitting element ED may be disposed on the fourth insulating layer 160. In an embodiment, the light-emitting element ED may include an anode electrode AE, an emissive layer EL, and a common electrode CE.

The pixel electrode ANO may overlap (e.g., in the third direction DR3) with each of a first emission area EA1, a second emission area EA2 and a third emission area, and at least a portion of the pixel electrode ANO may be extended to a light-blocking area BA. The pixel electrode ANO may be connected to the source electrode SE of the transistor. For example, in an embodiment the pixel electrode ANO may include at least one of aluminum (Al), silver (Ag), copper (Cu), nickel (Ni), and lanthanum (La). For another example, the pixel electrode ANO may include a material such as indium tin oxide (ITO), indium zinc oxide (IZO) and indium tin zinc oxide (ITZO). As still another example, the pixel electrode ANO may include a plurality of layers having a transparent conductive material layer and a highly reflective metal layer, or may include a single layer including a transparent conductive material and a highly reflective metal. In an embodiment, the pixel electrode ANO may have a stack structure such as ITO/Ag/ITO/, ITO/Ag/IZO, or ITO/Ag/ITZO/IZO.

The pixel-defining layer 170 may be disposed on the pixel electrode ANO. The pixel-defining layer 170 may define the first emission area ELA1, the second emission area ELA2 and the third emission area ELA3 as openings exposing the pixel electrode ANO. The pixel-defining layer 170 may be in line with the bank BK and the light-blocking area BA in the third direction DR3. The pixel-defining layer 170 may include an organic insulating material.

The emissive layer EL may be disposed on the pixel electrode ANO. For example, the emissive layer EL may extend across the first to third emission areas EA1, EA2 and EA3 and the light-blocking area BA. The emissive layer EL may be disposed only in the display area DA, but embodiments of the present disclosure are not necessarily limited thereto. In an embodiment, the light-emitting element ED may emit light with a peak wavelength from 440 nm to 480 nm. The light emitted from the light-emitting element ED may be, but is not necessarily limited to, blue light.

For example, the emissive layer EL may be an organic emissive layer including an organic material. The emissive layer EL may include a hole transporting layer, an organic light-emitting layer and an electron transporting layer. When the pixel electrode ANO receives a voltage and the common electrode CE receives a cathode voltage through the transistor, holes may move to the organic emissive layer through the hole transporting layer, and electrons may move to the organic light-emitting layer through the electron transporting layer, such that they combine in the organic emissive layer to emit light. For example, the pixel electrode may be an anode electrode while the common electrode may be a cathode electrode. It is, however, to be understood that embodiments of the present disclosure are not necessarily limited thereto.

As another example, the light-emitting elements ED may include quantum-dot light-emitting diodes each including a quantum-dot emissive layer, inorganic light-emitting diodes each including an inorganic semiconductor, or micro light-emitting diodes.

The common electrode CE may be disposed on the emissive layer EL. For example, the common electrode CE may be disposed on the emissive layer EL and may extend across the first to third emission areas EA1, EA2 and EA3 and the light-blocking area BA. The common electrode CE may completely cover the emissive layer EL.

The common electrode CE may be translucent or transmissive. In an embodiment in which the thickness of the common electrode CE ranges from several tens to several hundred angstroms, the common electrode CE may be semi-transmissive. For example, if the common electrode CE is translucent, the common electrode CE may include Ag, Mg, Cu, Al, Pt, Pd, Au, Ni, Nd, Ir, Cr, Li, Ca, LiF/Ca, LiF/Al, Mo, Ti or a compound or a mixture thereof, e.g., a mixture of Ag and Mg. For another example, the common electrode CE may include transparent conductive oxide and may have transparency. In an embodiment in which the cathode electrode CE has the transparency, the common electrode CE may be formed of tungsten oxide (WxOx), titanium oxide ($TiO_2$), indium tin oxide (ITO), indium zinc oxide (IZO), zinc oxide (ZnO), indium tin zinc oxide MgO (magnesium oxide), etc.

The encapsulation layer TFEL may be disposed on the emission material layer EML. The encapsulation layer TFEL may be disposed on (e.g., disposed directly thereon in the third direction DR3) the common electrode CE to cover the light-emitting elements ED. In an embodiment, the encapsulation layer TFEL may include a first encapsulation layer TFE1, a second encapsulation layer TFE2 and a third encapsulation layer TFE3 stacked on the common electrode CE sequentially (e.g., in the third direction DR3).

The first encapsulation layer TFE1 may be disposed on the common electrode CE (e.g., disposed directly thereon in the third direction DR3). In an embodiment, the first encapsulation layer TFE1 may include an inorganic material to prevent oxygen or moisture from permeating into the emission material layer EML. For example, the first inorganic layer TFE1 may include, but is not necessarily limited to, at least one of: a silicon nitride layer, a silicon oxynitride layer, a silicon oxide layer, a titanium oxide layer, an aluminum oxide layer, and an amorphous silicon layer.

The second encapsulation layer TFE2 may be disposed on (e.g., disposed directly thereon in the third direction DR3) the first encapsulation layer TFE1 to provide a flat surface over the emission material layer EML. In an embodiment, the second encapsulation layer TFE2 may include an organic material to protect the emission material layer EML from foreign substances such as dust. For example, the second encapsulation layer TFE2 may include an organic film such as an acrylic resin, an epoxy resin, a phenolic resin, a polyamide resin and a polyimide resin. In an embodiment, the second encapsulation layer TFE2 may be formed by curing a monomer or applying a polymer.

The third encapsulation layer TFE3 may be disposed on the second encapsulation layer TFE2 (e.g., disposed directly thereon in the third direction DR3). In an embodiment, the third encapsulation layer TFE3 may include an inorganic material to prevent oxygen or moisture from permeating into the emission material layer EML. For example, the third encapsulation layer TFE3 may be made of the above-listed materials as the material of the first encapsulation layer TFE1.

The opposing substrate TSUB may be opposed to the substrate SUB (e.g., in the third direction DR3). The opposing substrate TSUB may encapsulate the emission material layer EML together with the substrate SUB. The opposing substrate TSUB may include a transparent material.

The color filter layer CFL may be disposed on a surface of the opposing substrate TSUB that faces the substrate SUB. In an embodiment, the color filter layer CFL may include a first color filter 321, a second color filter 322, and a third color filter 323. The first color filter 321 may selectively transmit a first light and block or absorb a second light and a third light. The second color filter 322 may selectively transmit the second light and block or absorb the first light and the third light. The third color filter 323 may selectively transmit the third light and block or absorb the first light and the second light.

In an embodiment, the first color filter 321 may be a blue color filter and may include a blue colorant. Herein, the colorant encompasses a dye as well as a pigment. The first color filter 321 may include a base resin, and the blue colorant may be dispersed in the base resin. For example, the second color filter 322 may be a red color filter and may include a red colorant. The second color filter 322 may include a base resin, and the red colorant may be dispersed in the base resin. For example, the third color filter 323 may be a green color filter and may include a green colorant. The third color filter 323 may include a base resin, and the green colorant may be dispersed in the base resin.

The first color filter 321 may include a first filtering region 321*a* and a first light-blocking area 321*b* surrounding the first filtering region 321*a* (e.g., in a plan view). The first filtering region 321*a* may be in line with the first emission area EA1. The first light-blocking area 321*b* may surround the first filtering region 321*a* in line with the first emission area EA1, may not overlap the second emission area EA2 or the third emission area EA3, and may be in line with the light-blocking area BA. In an embodiment, the first filtering region 321*a* may be a blocking filter that blocks red light and green light.

The second color filter 322 may include a second filtering region 322*a* and a second light-blocking area 322*b* surrounding the second filtering region 322*a* (e.g., in a plan view). The second filtering region 322*a* may be in line with the second emission area EA2. The second light-blocking area 322*b* may surround the second filtering region 322*a* in line with the second emission area E21, may not overlap the first emission area EA1 or the third emission area EA3, and may be in line with the light-blocking area BA. In an embodiment, the second filtering region 322*a* of the second color filter 322 may work as a blocking filter that blocks blue light and green light.

The third color filter 323 may include a third filtering region 323*a* and a third light-blocking area 323*b* surrounding the third filtering region 323*a* (e.g., in a plan view). The third filtering region 323*a* may be in line with the third emission area EA3. The third light-blocking area 323*b* may surround the third filtering region 323*a* in line with the third emission area EA3, may not overlap the first emission area EA1 or the second emission area EA2, and may be in line with the light-blocking area BA. In an embodiment, the third filtering region 323*a* of the third color filter 323 may work as a blocking filter that blocks blue light and red light.

A light-blocking pattern BM may have a structure in which the first light-blocking area 321*b* of the first color filter 321, the second light-blocking area 322*b* of the second color filter 322, and the third light-blocking area of the third color filter 323 are stacked on one another. For another example, the light-blocking pattern BM may be formed via coating and exposure processes of a separate organic light-blocking material. The light-blocking pattern BM may absorb all of the first to third lights.

A low-refractive layer LR and a first capping layer CPL1 may be disposed between the color filter layer CFL and the wavelength conversion layer WCL (e.g., in the third direction DR3). The low-refractive layer LR has a lower refractive index than a first transparent member TPL, a second transparent member WCL1 and a third transparent member WCL2, and thus the total reflection of light traveling from the first transparent member TPL, the second transparent member TPL and the third transparent member WCL2 to the low-refractive layer LR is induced, so that the light can be recycled.

The low-refractive layer LR may include an organic material. For example, in an embodiment the refractive index of the low-refractive layer LR may be less than or equal to about 1.3. With the low-refractive layer LR having the refractive index of less than or equal to about 1.3, the total reflection of light can sufficiently occur because the difference in refractive index between the first transparent member TPL, the second transparent member WCL1 and the third transparent member WCL2 is large.

In addition, the low-refractive layer LR may cover the level differences created by the light-blocking areas 321*b*, 322*b* and 323*b* of the color filter layer CFL to provide a flat surface. Accordingly, the first capping layer CPL1 may be formed to be flat on a surface of the low-refractive layer LR.

The first capping layer CPL1 may be disposed between the low-refractive layer LR and the wavelength conversion layer WCL to cover the low-refractive layer LR. The first capping layer CPL1 can prevent impurities such as moisture and air from permeating from the outside (e.g., the external environment) into the low-refractive layer LRL or the color filter layer CFL to damage or contaminate the low-refractive layer LRL and the color filter layer CFL.

The first capping layer CPL1 may include an inorganic material. For example, the first capping layer CPL1 may be made up of, but is not necessarily limited to, at least one layer containing an inorganic material such as $SiO_2$, SiNx and SiON.

The wavelength conversion layer WCL may be disposed between the first capping layer CPL1 and the filling layer FIL (e.g., in the third direction DR3). In an embodiment, the wavelength conversion layer WCL may include a bank BK, a first transparent member TPL, a second transparent member WCL1, a third transparent member WCL2 and a second capping layer CPL2.

The bank BK may be disposed on a surface of the first capping layer CPL1 that faces the substrate SUB to form a space for accommodating each of the first to third transparent members TPL, WCL1 and WCL2. The bank BK may define the space where the first to third transparent members TPL, WCL1 and WCL2 are disposed. The bank BK may surround the first to third transparent members TPL, WCL1 and WCL2 when viewed from the top. The bank BK may be in line with the light-blocking area BA and may overlap with none of the first to third emission areas EA1, EA2 and EA3. For example, the bank BK may include, but is not necessarily limited to, an organic material that has photocurability or an organic material that has photocurability and contains a light-blocking material.

The first transparent member TPL may be disposed in the space defined by the bank BK and may be in line with the first emission area EA1 in the third direction DR3. The upper surface of the first transparent member TPL may be in direct contact with the first capping layer CPL1, and the side surface (e.g., lateral side surfaces) of the first transparent member TPL may be in direct contact with the bank BK.

The first transparent member TPL may be a light-transmitting pattern that transmits incident light. The first transparent member TPL may transmit the light of the first color emitted from the emission material layer EML as it is. For example, in an embodiment the light emitted from the light-emitting element ED may be blue light, and it may be output to the outside of the display device 10 through the first transparent member TPL and the first filtering region 321*a* of the first color filter 321. Accordingly, the first light L1 exiting to the outside from the first emission area EA1 may be blue light.

In an embodiment, the first transparent member TPL may include a base resin 330 and light scatterers 331. The base resin 330 may include an organic material with high light transmittance. For example, the base resin 330 may include, but is not limited to, an organic material such as an epoxy resin, an acrylic resin, a cardo resin and an imide resin.

The light scatterers 331 may have a refractive index different from that of the base resin 330 and may form an optical interface with the base resin 330. The light scatterers 331 may be light-scattering particles. The light scatterers 331 may scatter light in random directions regardless of the direction in which the incident light is incoming, without substantially changing the wavelength of the light transmitting the first emission area EA1.

The light scatterers 331 may be a material that scatters at least a part of transmitted light and may include metal oxide particles or organic particles. For example, the light scatterers 331 may include a metal oxide such as titanium oxide ($TiO_2$), zirconium oxide ($ZrO_2$), aluminum oxide ($Al_2O_3$), indium oxide ($In_2O_3$), zinc oxide (ZnO) and tin oxide ($SnO_2$), and may include the organic particles such as an acrylic resin and a urethane resin. It should be understood, however, that embodiments of the present disclosure are not necessarily limited thereto.

The second transparent member WCL1 may be disposed in the space defined by the bank BK and may be in line with the second emission area EA2 in the third direction DR3. The upper surface of the second transparent member WCL1 may be in direct contact with the first capping layer CPL1, and the side surface of the second transparent member WCL1 may be in direct contact with the bank BK.

The second transparent member WCL1 may convert or shift the peak wavelength of the incident light into light of another peak wavelength to output the light. The second transparent member WCL1 may convert the light of the first color emitted from the emission material layer EML into light of the second color to output the light. For example, in an embodiment the light emitted from the light-emitting element ED may be blue light, and it may be converted into red light having a peak wavelength in the range of approximately 610 nm to 650 nm through the second transparent member WCL1 and the second filtering region 322*a* of the second color filter 322. Accordingly, the second light L2 exiting to the outside from the second emission area EA2 may be red light.

The second transparent member WCL1 may include a base resin 330, light scatterers 331 dispersed in the base resin 330, and first wavelength shifters 332 dispersed in the base resin 330.

The first wavelength shifters 332 may convert or shift the peak wavelength of the incident light to another peak wavelength. In an embodiment, the first wavelength shifters 332 may convert the blue light output from the light-emitting element ED into red light having a peak wavelength in the range of approximately 610 nm to 650 nm so that the red light exits.

For example, the first wavelength shifters 332 may be, but is not necessarily limited to, quantum dots, quantum rods, or phosphor. In the following description, the first wavelength shifters 332 are quantum dots. The quantum dots may be particulate matter that emits a color as electrons transition from the conduction band to the valence band. The quantum dots may be semiconductor nanocrystalline material. The quantum dots have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

In an embodiment, the light output from the first wavelength shifters 332 may have a full width at half maximum (FWHM) of the emission wavelength spectrum of approximately 45 nm or less, approximately 40 nm or less, or approximately 30 nm or less. Accordingly, the color purity and color gamut of the colors displayed by the display device 10 can be further increased. The light output from the first wavelength shifters 332 may travel in different directions regardless of the incidence direction of the incident light. Accordingly, the first wavelength shifters 332 can increase the side visibility of the second color displayed in the second emission area EA2.

A portion of the light output from the light-emitting element ED may be transmitted through the second transparent member WCL1 to exit without being converted into red light by the first wavelength shifters 332. The components of the light whose wavelength is not converted by the second transparent member WCL1 and incident on the second filtering region 322*a* of the second color filter 322 may be blocked by the second filtering region 322*a*. On the other hand, red light converted by the second transparent member WCL1 may be transmit through the second filtering region 322*a* to exit to the outside.

The third transparent member WCL2 may be disposed in the space defined by the bank BK and may be in line with the third emission area EA3 in the third direction DR3. In an embodiment, the upper surface of the third transparent member WCL1 may be in direct contact with the first capping layer CPL1, and the side surface of the third transparent member WCL2 may be in direct contact with the bank BK.

The third transparent member WCL2 may convert or shift the peak wavelength of the incident light into light of another peak wavelength to output the light. For example, in an embodiment the light emitted from the light-emitting element ED may be blue light, and it may be converted into green light having a peak wavelength in the range of approximately 510 nm to 550 nm through the second transparent member WCL1 and the second filtering region 322*a* of the second color filter 322. Accordingly, the third light L3 exiting to the outside from the third emission area EA3 may be green light.

The third transparent member WCL2 may include a base resin 330, light scatterers 331 dispersed in the base resin 330, and second wavelength shifters 333 dispersed in the base resin 330.

The second wavelength shifters 333 may convert or shift the peak wavelength of the incident light to another peak wavelength. The second wavelength shifters 333 may convert the blue light output from the light-emitting element ED into green light having a peak wavelength in the range of approximately 510 nm to 550 nm so that the green light exits. For example, the second wavelength shifters 333 may be, but is not necessarily limited to, quantum dots, quantum rods, or phosphor. The second wavelength shifters 333 of quantum dots may have substantially the same configuration as the first wavelength shifters 332 of quantum dots as described above; and, therefore, the redundant descriptions may be omitted for economy of description.

A portion of the light output from the light-emitting element ED may be transmitted through the second transparent member WCL1 to exit without being converted into green light by the second wavelength shifters 333. The components of the light incident on the third filtering region 323a of the third color filter 323 without its wavelength converted by the third transparent member WCL2 may be blocked by the third filtering region 323a. On the other hand, green light converted by the third transparent member WCL2 may be transmitted through the third filtering region 323a to exit to the outside.

The second capping layer CPL2 may be disposed under the bank BK, the first transparent member TPL, the second transparent member WCL1 and the third transparent member WCL2 (e.g., directly thereunder in a direction opposite to the third direction DR3) to prevent impurities such as moisture and air from permeating from the outside to damage or contaminate the first transparent member TPL, the second transparent member WCL1 and the third transparent member WCL2. The second capping layer CPL2 may cover the first transparent member TPL, the second transparent member WCL1 and the third transparent member WCL2.

A spacer layer SPC may be disposed on the lower surface of the second capping layer CPL2 (e.g., disposed directly thereon in a direction opposite to the third direction DR3). The spacer layer SPC may maintain a cell gap between the substrate SUB and the opposing substrate TSUB. The spacer SPC may surround the first to third transparent members TPL, WCL1 and WCL2 when viewed from the top. The spacer SPC may be in line with the light-blocking area BA and may overlap with none of the first to third emission areas EA1, EA2 and EA3.

In an embodiment, the spacer layer SPC may include, but is not necessarily limited to, a transparent organic material that has photocurability or an organic material that has photocurability and contains a light-blocking material. For example, the spacer layer SPC may be made of acrylic resin, methacrylic resin, polyisoprene, vinyl resin, epoxy resin, urethane resin, cellulose resin and perylene resin.

The filling layer FIL may be disposed between the opposing substrate TSUB and the substrate SUB (e.g., in the third direction DR3). The filling layer FIL may be interposed between the wavelength conversion layer WCL and the encapsulation layer TFEL to fill the space between the wavelength conversion layer WCL and the encapsulation layer TFEL. For example, The filling layer FIL may be in direct contact with the third encapsulation layer TFE3 of the encapsulation layer TFEL and the second capping layer CPL2 of the wavelength conversion layer WCL. It should be understood, however, that embodiments of the present disclosure are not necessarily limited thereto.

Figure 6:
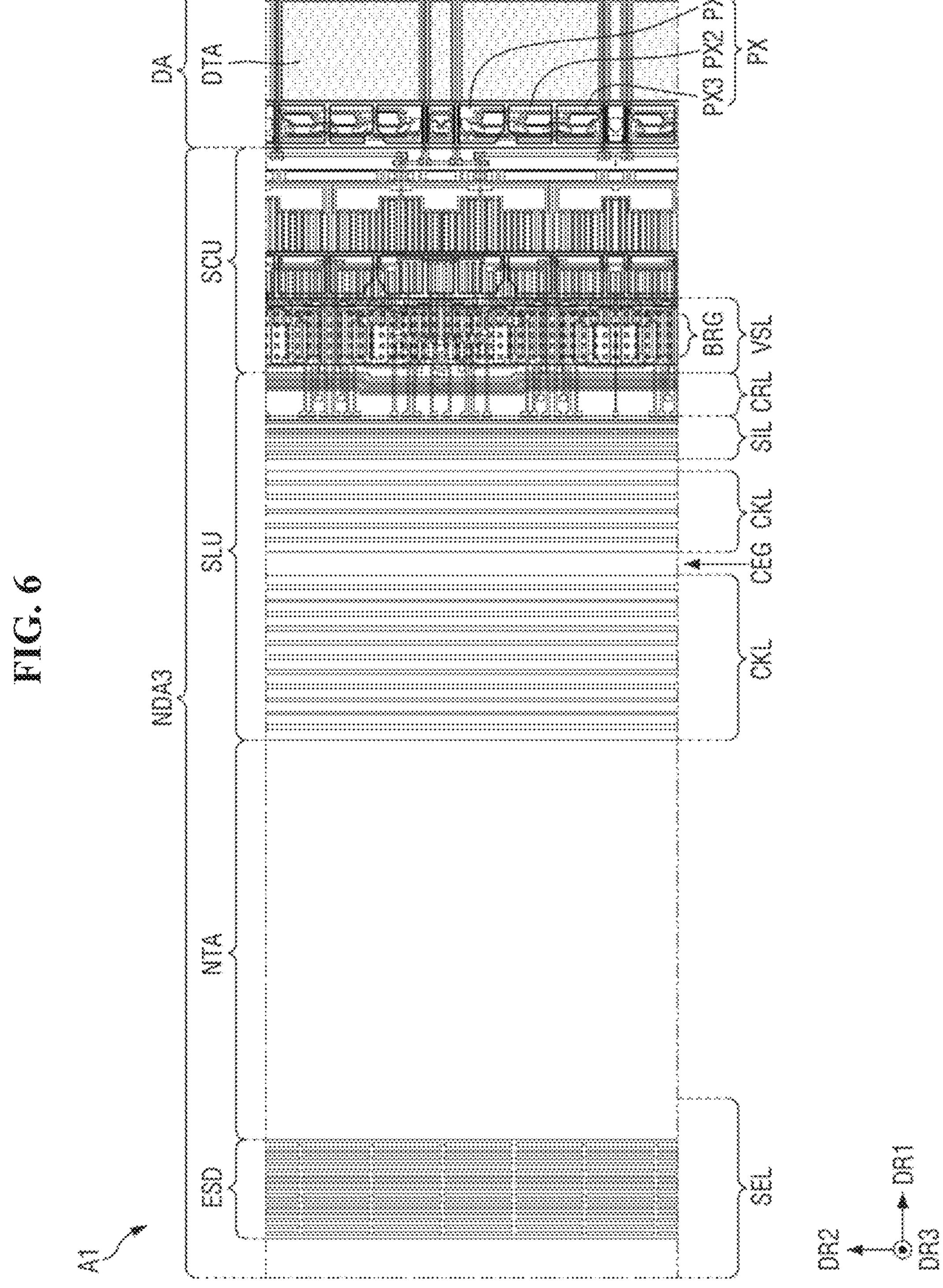
FIG. 6 is an enlarged view of area A1 of FIG. 1 according to an embodiment of the present disclosure.

FIG. 6 is an enlarged view of area A1 of FIG. 1.

Referring to FIG. 6, in an embodiment the display area DA may include first to third pixels PX1, PX2 and PX3 and a display transmissive area DTA. The first pixel PX1 may emit the first light L1 through the first emission area EA1 of FIG. 5. The second pixel PX2 may emit the second light L2 through the second emission area EA2 of FIG. 5. The third pixel PX3 may emit the third light L3 through the third emission area EA3 of FIG. 5.

The display transmissive area DTA may be located on a side of the first to third pixels PX1, PX2 and PX3. In an embodiment, the first to third pixels PX1, PX2 and PX3 may be adjacent to each other in the second direction DR2. The display transmissive area DTA may be adjacent to the first to third pixels PX1, PX2 and PX3 in the first direction DR1. In an embodiment, the area of the display transmissive area DTA (e.g., in a plan view) may be greater than the sum of the areas of the first to third pixels PX1, PX2 and PX3 (e.g., in a plan view).

In an embodiment, the display transmissive area DTA may not include a transistor, a light-emitting element ED, a signal line, or a voltage line. The display transmissive area DTA can transmit light incident on a surface of the display device 10 to the opposite surface of the display device 10 as it is. Accordingly, as the display device includes the display transmissive area DTA disposed in the display area DA. it is possible to implement a transparent display panel.

In an embodiment, the non-display area NDA may include first to fourth non-display areas NDA1, NDA2, NDA3 and NDA4, and the third non-display area NDA3 may be located on the left side of the display area DA (e.g., in a direction opposite to the first direction DR1).

In an embodiment, the third non-display area NDA3 may include a scan driver SIC, a non-display transmissive area NTA, and an anti-electrostatic element ESD. The scan driver SIC may include a scan circuit and a scan line area SLU.

The scan circuit SCU may be located on the left side of the display area DA (e.g., in a direction opposite to the first direction DR1). The scan circuit SCU may include a plurality of transistors and a buffer circuit. The scan circuit SCU may receive a clock signal, a scan input signal and a carry signal and output a scan signal and a sensing signal. In an embodiment, the transistor and the buffer circuit of the scan circuit SCU may be disposed in the same layer as a bottom metal layer BML, a semiconductor layer ACT, a gate layer, and a source metal layer. The gate layer may include the gate electrode GE of FIG. 5, and the source metal layer may include the drain electrode DE and source electrode SE of FIG. 5.

The second voltage line VSL may be disposed on the left side of the scan circuit SCU (e.g., in a direction opposite to the first direction DR1). The second voltage line VSL may be disposed in the same layer as the pixel electrode ANO of FIG. 5, but embodiments of the present disclosure are not necessarily limited thereto. In an embodiment, the second voltage line VSL may include a plurality of holes, and the fourth insulating layer 160 and the pixel-defining layer 170 of FIG. 5 may be in direct contact with each other through the holes of the second voltage line VSL. The second voltage line VSL may be arranged along the first to fourth non-display areas NDA1, NDA2, NDA3 and NDA4 to surround the display area DA (e.g., in a plan view) such that it is spaced apart from it. The second voltage line VSL may be a low-level voltage line. The second voltage line VSL disposed in the non-display area NDA may receive a low-level voltage and may be electrically connected to the common electrode CE of the display area DA.

A bridge contact BRG may be located on the left side in the scan circuit SCU. The bridge contact BRG may be in direct contact with the source metal layer, the second voltage line VSL and the common electrode CE. Accordingly, in an embodiment the common electrode CE may extend to the non-display area NDA beyond the display area DA, and may receive a low-level voltage from the second voltage line VSL through the bridge contact BRG.

The scan line area SLU may be located on the left side of the scan circuit SCU (e.g., in a direction opposite to the first direction DR1). In an embodiment, the scan line area SLU may include a clock line CKL, a scan input line SIL, and a carry line CRL.

The clock line CKL may be disposed on the left side of the scan line area SLU (e.g., in a direction opposite to the first direction DR1). The clock line CKL may be disposed between the non-display transmissive area NTA and the scan input line SIL (e.g., in the first direction DR1). The clock line CKL may include a plurality of lines extending longitudinally in the second direction DR2 and spaced apart from one another in the first direction DR1. The clock lines CKL may provide (e.g., send) a clock signal received from the flexible films FPC to the scan circuit SCU.

The cathode edge CEG may be disposed between the clock lines CKL (e.g., in the first direction DR1). The common electrode CE may extend to the cathode edge CEG of the non-display area NDA beyond the display area DA. The cathode edge CEG may not overlap with the lines of the clock line CKL (e.g., in a plan view).

The scan input line SIL may be disposed on the right side of the clock line CKL (e.g., in the first direction DR1). The scan input line SIL may be disposed between the clock line CKL and the carry line CRL (e.g., in the first direction DR1). The scan input line SIL may include a plurality of lines extending longitudinally in the second direction DR2 and spaced apart from one another in the first direction DR1. The scan input line SIL may provide a scan input signal received from the flexible films FPC to the scan circuit SCU.

The carry line CRL may be disposed on the right side of the scan input line SIL (e.g. in the first direction DR1). The carry line CRL may be disposed between the scan input line SIL and the scan circuit SCU (e.g., in the first direction DR1). The carry line CRL may include a plurality of lines extending longitudinally in the second direction DR2 and spaced apart from one another in the first direction DR1. The carry line CRL may provide the carry signal received in the previous stage of the scan circuit SCU to the subsequent stage of the scan circuit SCU.

The non-display transmissive area NTA may be located between the anti-electrostatic element ESD and the scan line area SLU (e.g., in the first direction DR1). The non-display transmissive area NTA may not include a metal layer, a transistor, a signal line, or a voltage line. The non-display transmissive area DTA can transmit light incident on a surface of the display device 10 to the opposite surface of the display device 10 as it is. In an embodiment, the area of the non-display transmissive area NTA (e.g., in a plan view) may be larger than the area of the scan circuit SCU (e.g., in a plan view) or the area of the anti-electrostatic element ESD (e.g., in a plan view). For example, the width of the non-display transmissive area NTA in the first direction DR1 may be greater than the width of the scan circuit SCU in the first direction DR1 or the width of the anti-electrostatic element ESD in the first direction DR1 while lengths in the second direction DR2 of each of the non-display transmissive area NTA, scan circuit SCU and anti-electrostatic element ESD may be identical or similar to each other. In an embodiment, the width of the non-display transmissive area NTA in the first direction DR1 may be greater than the width of one display transmissive area DTA corresponding to the first to third pixels PX1, PX2 and PX3 in the first direction DR1. Accordingly, as the display device 10 includes the non-display transmissive area NTA disposed in the non-display area NDA and having a predetermined area, it is possible to avoid a high-density metal pattern in the non-display area NDA to make the non-display area NDA less noticeable. As a result, a transparent display panel can be implemented.

The anti-electrostatic element ESD may be disposed at the outermost portion of the non-display area NDA (e.g., in the direction opposite to the first direction DR1). The anti-electrostatic element ESD may overlap with the sealing member SEL of FIG. 4. The anti-electrostatic element ESD may be disposed on the left side of the non-display transmissive area NTA (e.g., in the direction opposite to the first direction DR1). The anti-electrostatic element ESD may be arranged along the first to fourth non-display areas NDA1, NDA2, NDA3 and NDA4 to surround the display area DA (e.g., in a plan view) such that it is spaced apart from it. The anti-electrostatic element ESD can prevent static electricity from being introduced into the display device 10 by eliminating static electricity introduced from the outside. In an embodiment, the anti-electrostatic element ESD may be disposed in the same layer as the bottom metal layer BML and the gate layer, but embodiment of the present disclosure are not necessarily limited thereto.

Figure 7:
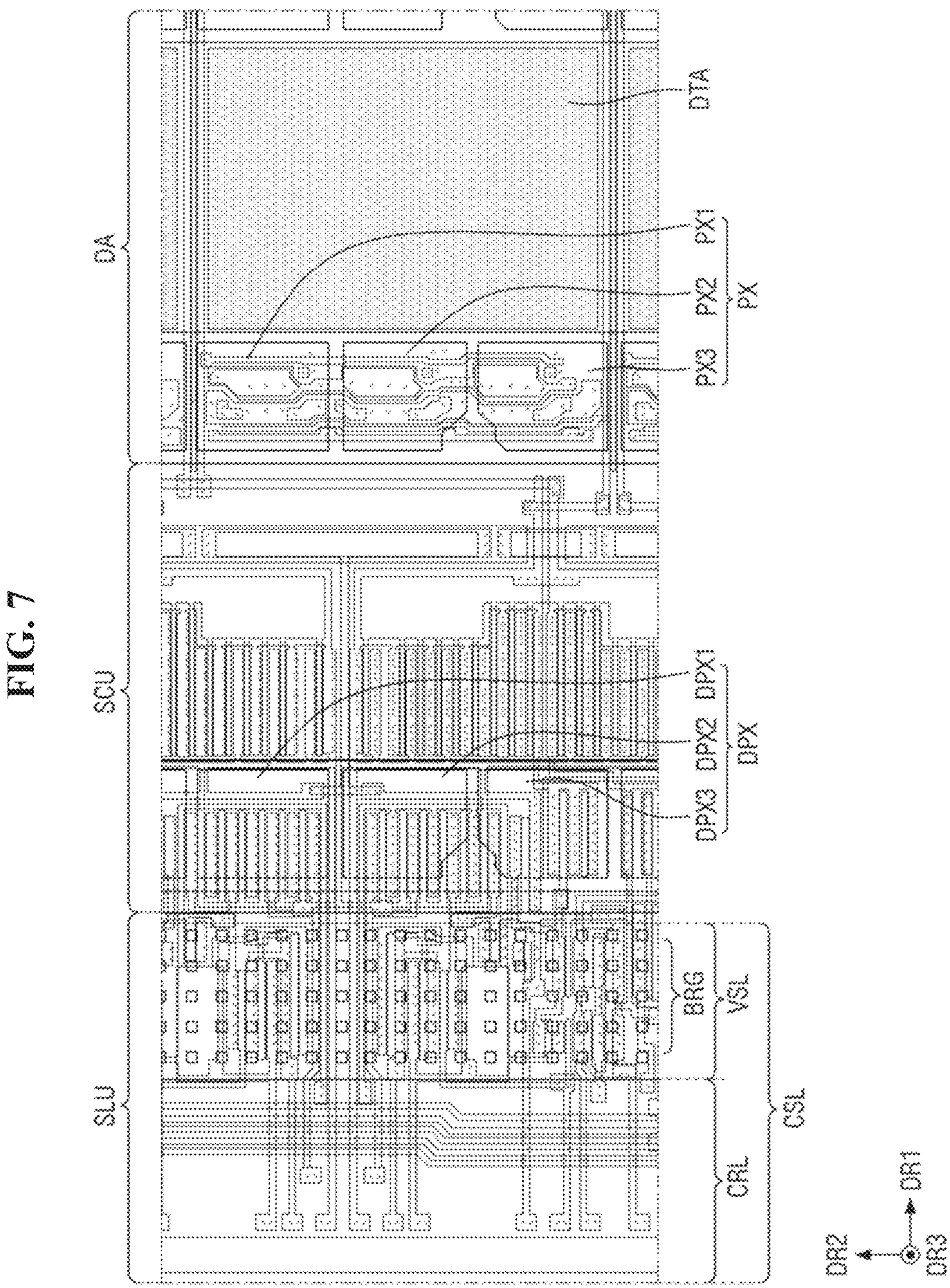
FIG. 7 is an enlarged view showing a portion of FIG. 6 according to an embodiment of the present disclosure.

FIG. 7 is an enlarged view showing a portion of FIG. 6.

Referring to FIG. 7, the non-display area NDA may include dummy pixels DPX. The dummy pixels DPX of the third non-display area NDA3 may be disposed on the left side of the pixels PX disposed on the left side in the display area DA. In an embodiment, the dummy pixels DPX may include first to third dummy pixels DPX1, DPX2 and DPX3. The first to third dummy pixels DPX1, DPX2 and DPX3 may have the same shape as the first to third pixels PX1, PX2 and PX3 (e.g., in a plan view) due to the bank BK of FIG. 5. In an embodiment, the first to third dummy pixels DPX1, DPX2 and DPX3, like the first to third pixels PX1, PX2 and PX3, may include the first to third color filters 321, 322 and 323 and the first to third transparent members TPL, WCL1 and WCL2. The first to third dummy pixels DPX1, DPX2 and DPX3 may not include a light-emitting element ED, unlike the first to third pixels PX1, PX, and PX3. Accordingly, the first to third dummy pixels DPX1, DPX2 and DPX3 may not emit light. The first to third dummy pixels DPX1, DPX2 and DPX3 may overlap with the scan circuit SCU.

The compensation layer CSL may overlap with the second voltage line VSL, the scan line area SLU and the non-display transmissive area NTA. In some embodiments, the compensation layer CSL may be extended (e.g., in the direction opposite to the first direction DR1) to the non-display transmissive area NTA beyond the scan line area SLU. The compensation layer CSL may surround the first to third dummy pixels DPX1, DPX2 and DPX3 (e.g., in a plan view). The compensation layer CSL may be disposed at the edge of the opposing substrate TSUB and surround the color filter layer CFL and the wavelength conversion layer WCL. In an embodiment, the compensation layer CSL may be disposed at the edge of the opposing substrate TSUB where the color filter layer CFL and the wavelength conversion layer WCL are not disposed to reduce the level difference, thereby stabilizing the structure of the display device 10. In an embodiment, the compensation layer CSL may include at least one organic layer, but the constituent material of the compensation layer CSL is not necessarily limited thereto.

Figure 8:
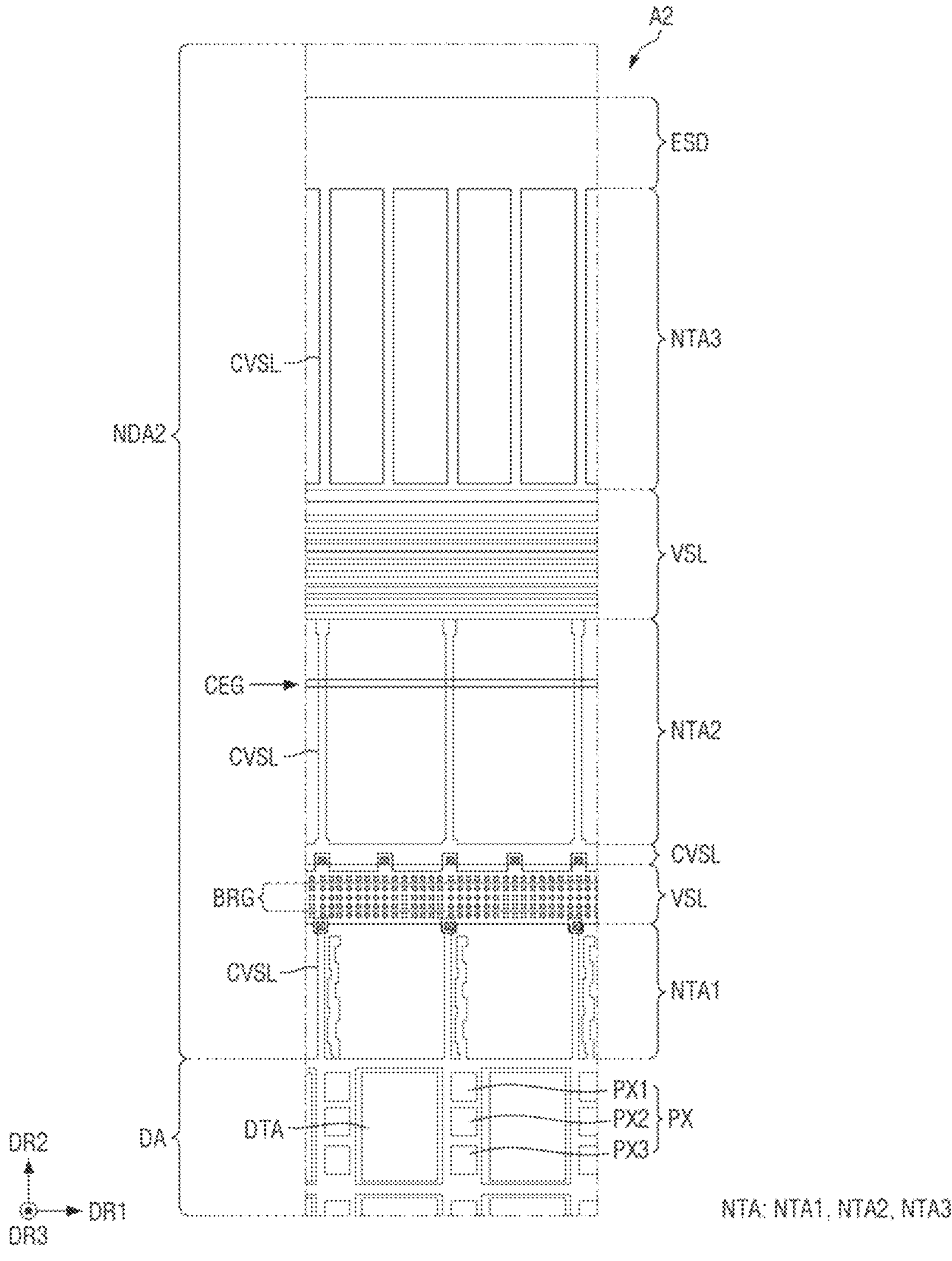
FIG. 8 is an enlarged view of area A2 of FIG. 1 according to an embodiment of the present disclosure.

FIG. 8 is an enlarged view of area A2 of FIG. 1.

Referring to FIG. 8, the display area DA may include first to third pixels PX1, PX2 and PX3 and a display transmissive area DTA. The display transmissive area DTA may be located on a side (e.g., a lateral side) of the first to third pixels PX1, PX2 and PX3. In an embodiment, the first to third pixels PX1, PX2 and PX3) may be adjacent to each other in the second direction DR2. The display transmissive area DTA may be adjacent to the first to third pixels PX1, PX2 and PX3 in the first direction DR1 and a direction opposite to the first direction DR1. The area of the display transmissive area DTA (e.g., in a plan view) may be greater than the sum of the areas of the first to third pixels PX1, PX2 and PX3 (e.g., in a plan view).

In an embodiment, the display transmissive area DTA may not include a transistor, a light-emitting element ED, a signal line, or a voltage line. The display transmissive area DTA can transmit light incident on a surface of the display device 10 to the opposite surface of the display device 10 as it is. Accordingly, as the display device includes the display transmissive area DTA disposed in the display area DA, it is possible to implement a transparent display panel.

In an embodiment, the non-display area NDA may include first to fourth non-display areas NDA1, NDA2, NDA3 and NDA4, and the second non-display area NDA2 may be located on the upper side of the display area DA (e.g., in the second direction DR2).

In an embodiment, the second non-display area NDA2 may include a non-display transmissive area NTA, a second voltage line VSL, a voltage connection line CVSL, and an anti-electrostatic element ESD. The non-display transmissive area NTA may include first to third non-display transmissive areas NTA1, NTA2 and NTA3.

The first non-display transmissive area NTA1 may be directly adjacent to the upper side of the display area DA (e.g., in the second direction DR2). The first non-display transmissive area NTA1 may be disposed between the display area DA and the second voltage line VSL (e.g., in the second direction DR2). The first non-display transmissive area NTA1 may not include a transistor, a signal line, or a voltage line. The first non-display transmissive area NTA1 can transmit light incident on a surface of the display device 10 to the opposite surface of the display device 10 as it is. The area (e.g., in a plan view) of one first non-display transmissive area NTA1 surrounded by a plurality of voltage connection lines CVSL, the second voltage line VSL and the display area DA may be larger than the area (e.g., in a plan view) of one display transmissive area DTA. Accordingly, as the display device 10 includes the first non-display transmissive area NTA1 directly adjacent to the display area DA, it is possible to avoid a high-density metal pattern in the non-display area NDA to make the non-display area NDA less noticeable. As a result, a transparent display panel can be implemented.

The second voltage line VSL or a first low-level voltage line may be disposed on the upper side of the first non-display transmissive area NTA1 (e.g., in the second direction DR2). In an embodiment, the second voltage line VSL may be disposed in the same layer as the pixel electrode ANO of FIG. 5, but embodiments of the present disclosure are not necessarily limited thereto. The second voltage line VSL may include a plurality of holes, and the fourth insulating layer 160 and the pixel-defining layer 170 of FIG. 5 may be in direct contact with each other through the holes of the second voltage line VSL. The second voltage line VSL overlapping with the bridge contact BRG may be connected to the second voltage line VSL of FIG. 6, and the second voltage line VSL may be arranged along the first to fourth non-display areas NDA1, NDA2, NDA3 and NDA4 to surround the display area DA (e.g., in a plan view) such that it is spaced apart from it. The second voltage line VSL disposed in the non-display area NDA may receive a low-level voltage and may be electrically connected to the common electrode CE of the display area DA.

The bridge contact BRG may overlap with the second voltage line VSL. The bridge contact BRG may be disposed between the first and second non-display transmissive areas NTA1 and NTA2. The bridge contact BRG may be in contact with the source metal layer, the second voltage line VSL and the common electrode CE. Accordingly, the common electrode CE may be extended to the non-display area NDA beyond the display area DA, and may receive a low-level voltage from the second voltage line VSL through the bridge contact BRG.

The second non-display transmissive area NTA2 may be disposed between the first and third non-display transmissive areas NTA1 and NTA3 (e.g., in the second direction DR2). The second non-display transmissive area NTA2 may be disposed between the second voltage lines VSL. In an embodiment, the second voltage line VSL disposed on the lower side of the second non-display transmissive area NTA2 may extend to the third non-display area NTA3, and the second voltage line VSL disposed on the upper side of the second non-display transmissive area NTA2 may not extend to the third non-display area NTA3. The second non-display transmissive area NTA2 may not include a transistor, a signal line, or a voltage line. The second non-display transmissive area NTA2 can transmit light incident on a surface of the display device 10 to the opposite surface of the display device 10 as it is. The area (e.g., in a plan view) of one second non-display transmissive area NTA2 surrounded by the plurality of voltage connection lines CVSL and the second voltage line VSL may be larger than the area (e.g., in a plan view) of one first non-display transmissive area NTA1. The width of one second non-display transmissive NTA2 in the second direction DR2 may be larger than the width of one first non-display transmissive area NTA1 in the second direction DR2 while lengths in the first direction DR1 of each of the second non-display transmissive area NTA2 and the first non-display transmissive area NTA1 may be identical or similar to each other. Accordingly, as the display device 10 includes the second non-display transmissive area NTA2, it is possible to avoid a high-density metal pattern in the non-display area NDA to make the non-display area NDA less noticeable. As a result, a transparent display panel can be implemented.

The cathode edge CEG may overlap with the second non-display stress area NTA2. In an embodiment, the common electrode CE may extend to the cathode edge CEG of the non-display area NDA beyond the display area DA. The common electrode CE may overlap with more than half of the second non-display transmissive area NTA2.

The second voltage line VSL or a second low-level voltage line may be disposed between the second and third non-display transmissive areas NTA2 and NTA3 (e.g., in the second direction DR2). In an embodiment, the second voltage line VSL may be disposed in the same layer as the drain electrode DE and the source electrode SE of FIG. 5, but embodiments of the present disclosure are not necessarily limited thereto. The second voltage line VSL may overlap with a partition wall or a dam that defines an edge of the encapsulation layer TFEL. The second voltage line VSL overlapping with the partition wall or the dam may not extend to the third non-display area NDA3. The second voltage line VSL may receive a low-level voltage and may be electrically connected to the common electrode CE of the display area DA through the voltage connection line CVSL.

The third non-display transmissive area NTA3 may be disposed between the second voltage line VSL and the anti-electrostatic element ESD (e.g., in the second direction DR2). The third non-display transmissive area NTA3 may not include a metal layer, a transistor, a signal line, or a voltage line. The third non-display transmissive area NTA3 can transmit light incident on a surface of the display device 10 to the opposite surface of the display device 10 as it is. In an embodiment, the width of one third non-display transmissive area NTA3 surrounded by the plurality of voltage connection lines CVSL, the second voltage line VSL and the anti-electrostatic element ESD in the second direction DR2 may be larger than the width of one second non-display transmissive area NTA2 in the second direction DR2 while lengths in the first direction DR1 of each of the second non-display transmissive area NTA2 and the third non-display transmissive area NTA3 may be identical or similar to each other. Thus, the area (e.g., in a plan view) of the third non-display transmissive area NTA3 may be larger than the area (e.g., in a plan view) of the second non-display transmissive area NTA2. For example, the second non-display area NDA2 may include a plurality of non-display transmissive areas, such as the first to third non-display transmissive areas NTA1 to NTA3, which may have respective areas in a plan view that increase towards an outer portion of the second non-display area NDA2. Accordingly, as the display device 10 includes the third non-display transmissive area NTA3, it is possible to avoid a high-density metal pattern in the non-display area NDA to make the non-display area NDA less noticeable. As a result, a transparent display panel can be implemented.

The anti-electrostatic element ESD may be disposed at the outermost portion of the non-display area NDA (e.g., in the second direction DR2). The anti-electrostatic element ESD may overlap with the sealing member SEL of FIG. 4. The anti-electrostatic element ESD may be disposed on the upper side of the third non-display transmissive area NTA3 (e.g., in the second direction DR2). The anti-electrostatic element ESD may be arranged along the first to fourth non-display areas NDA1, NDA2, NDA3 and NDA4 to surround the display area DA (e.g., in a plan view) such that it is spaced apart from it. The anti-electrostatic element ESD can prevent static electricity from being introduced into the display device 10 by eliminating static electricity introduced from the outside. In an embodiment, the anti-electrostatic element ESD may be disposed in the same layer as the bottom metal layer BML and the gate layer, but embodiments of the present disclosure are not necessarily limited thereto.

Figure 9:
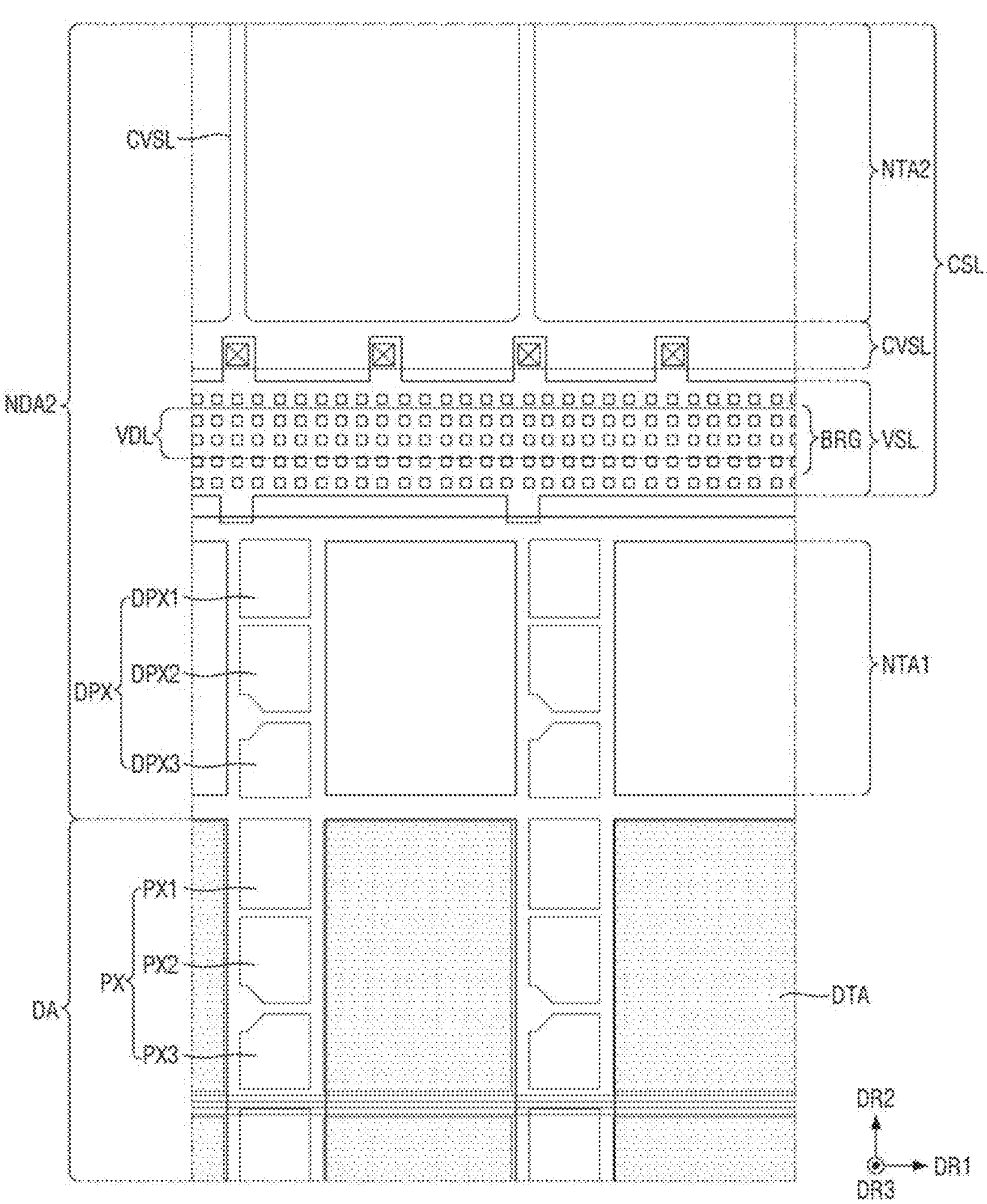
FIG. 9 is an enlarged view of a portion of FIG. 8 according to an embodiment of the present disclosure.

FIG. 9 is an enlarged view of a portion of FIG. 8.

Referring to FIG. 9, in an embodiment the non-display area NDA may include dummy pixels DPX. The dummy pixels DPX of the second non-display area NDA2 may be disposed on the upper side of the pixels PX disposed on the upper side in the display area DA. In an embodiment, the dummy pixels DPX may include first to third dummy pixels DPX1, DPX2 and DPX3. In an embodiment, the first to third dummy pixels DPX1, DPX2 and DPX3 may have the same shape as the first to third pixels PX1, PX2 and PX3 (e.g., in a plan view) due to the bank BK of FIG. 5. The first to third dummy pixels DPX1, DPX2 and DPX3, like the first to third pixels PX1, PX2 and PX3, may include the first to third color filters 321, 322 and 323, and the first to third transparent members TPL, WCL1 and WCL2. The first to third dummy pixels DPX1, DPX2 and DPX3 may not include a light-emitting element ED, unlike the first to third pixels PX1, PX, and PX3. Accordingly, the first to third dummy pixels DPX1, DPX2 and DPX3 may not emit light. The first to third dummy pixels DPX1, DPX2 and DPX3 may overlap with the voltage connection lines CVSL and the first non-display transmissive area NTA1.

The first voltage line VDL may overlap with the second voltage line VSL that overlaps with the bridge contact BRG. The first voltage line VDL may be disposed under the second voltage line VSL (e.g., in a direction opposite to the third direction DR3). The first voltage line VDL may be disposed between the first and second non-display transmissive areas NTA1 and NTA2. The first voltage line VDL may provide high-level voltage to the pixels PX in the display area DA (e.g., in the second direction DR2).

The compensation layer CSL may overlap with the second voltage line VSL, the voltage connection line CVSL and the second non-display transmissive area NTA2. The compensation layer CSL may surround the first to third dummy pixels DPX1, DPX2 and DPX3 (e.g., in a plan view). The compensation layer CSL may be disposed at the edge of the opposing substrate TSUB and surround the color filter layer CFL and the wavelength conversion layer WCL (e.g., in a plan view). In an embodiment, the compensation layer CSL may be disposed at the edge of the opposing substrate TSUB where the color filter layer CFL and the wavelength conversion layer WCL are not disposed to reduce the level difference, thereby stabilizing the structure of the display device 10. In an embodiment, the compensation layer CSL may include at least one organic layer, but the constituent material of the compensation layer CSL is not necessarily limited thereto.

Figure 10:
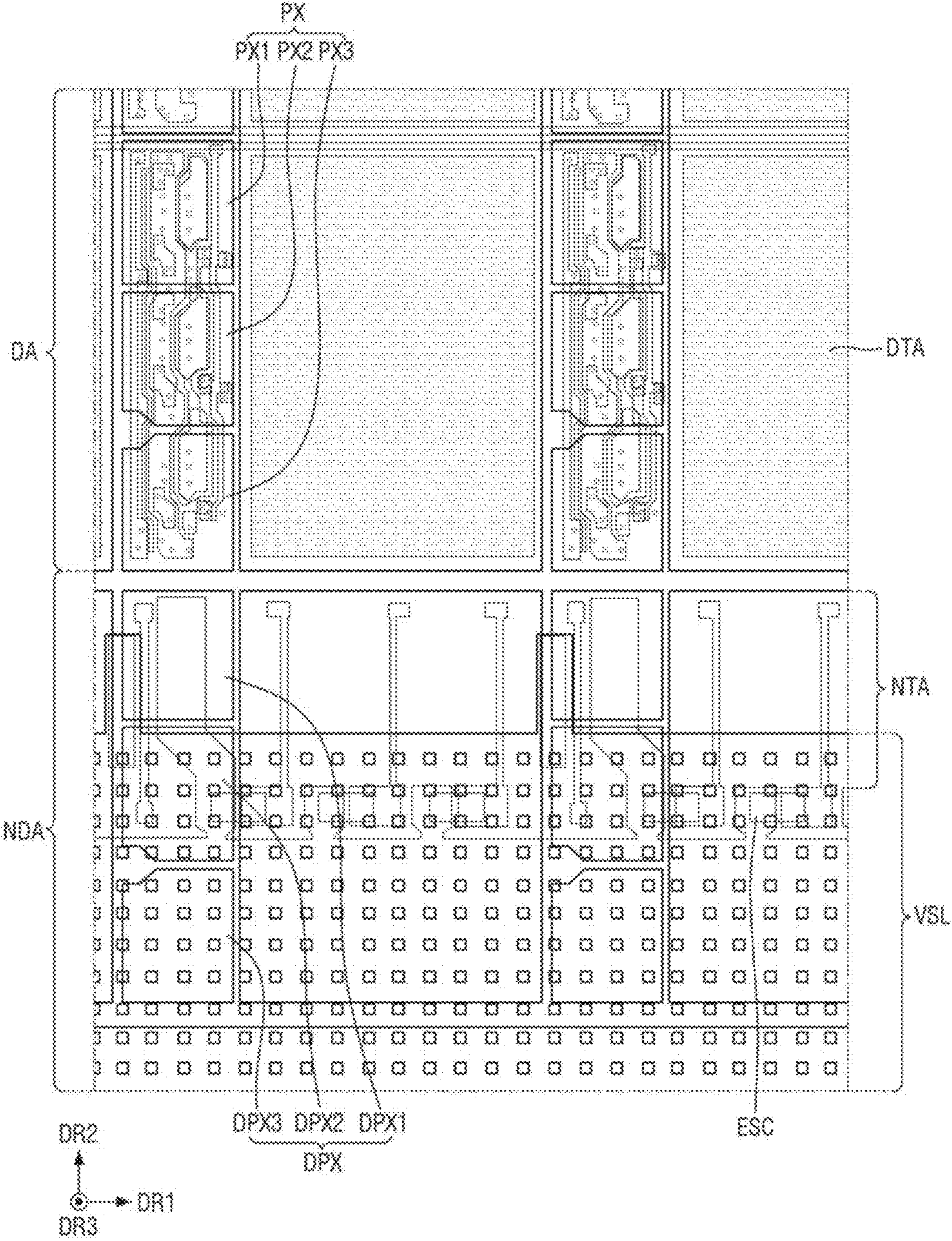
FIG. 10 is an enlarged view of area A3 of FIG. 1 according to an embodiment of the present disclosure.

FIG. 10 is an enlarged view of area A3 of FIG. 1.

Referring to FIG. 10, the non-display area NDA may include dummy pixels DPX. The dummy pixels DPX of the first non-display area NDA1 may be disposed on the lower side of the pixels PX (e.g., in the direction opposite to the second direction DR2) disposed on the lower side in the display area DA. In an embodiment, the dummy pixels DPX may include first to third dummy pixels DPX1, DPX2 and DPX3. The first to third dummy pixels DPX1, DPX2 and DPX3 may have the same shape (e.g., in a plan view) as the first to third pixels PX1, PX2 and PX3 due to the bank BK of FIG. 5. In an embodiment, the first to third dummy pixels DPX1, DPX2 and DPX3, like the first to third pixels PX1, PX2 and PX3, may include the first to third color filters 321, 322 and 323, and the first to third transparent members TPL, WCL1 and WCL2. The first to third dummy pixels DPX1, DPX2 and DPX3 may not include a light-emitting element ED, unlike the first to third pixels PX1, PX, and PX3. Accordingly, the first to third dummy pixels DPX1, DPX2 and DPX3 may not emit light. The first and second dummy pixels DPX1 and DPX2 may overlap with the non-display transmissive area NTA, and the second and third dummy pixels DPX2 and DPX3 may overlap with the second voltage line VSL.

The second voltage line VSL may be disposed on the lower side of the non-display transmissive area NTA (e.g., in a direction opposite to the second direction DR2). In an embodiment, the second voltage line VSL may be disposed in the same layer as the pixel electrode ANO of FIG. 5, but embodiments of the present disclosure are not necessarily limited thereto. In an embodiment, the second voltage line VSL may include a plurality of holes, and the fourth insulating layer 160 and the pixel-defining layer 170 of FIG. 5 may be in direct contact with each other through the holes of the second voltage line VSL. The second voltage line VSL may be arranged along the first to fourth non-display areas NDA1, NDA2, NDA3 and NDA4 to surround the display area DA (e.g., in a plan view) such that it is spaced apart from it. The second voltage line VSL disposed in the non-display area NDA may receive a low-level voltage and may be electrically connected to the common electrode CE of the display area DA.

An anti-electrostatic circuit ESC may be disposed between the second voltage line VSL and the non-display transmissive area NTA. The anti-electrostatic circuit ESC may be disposed on the lower side of the non-display transmissive area NTA (e.g., in a direction opposite to the second direction DR2). The anti-electrostatic circuit ESC can prevent static electricity from being introduced into the display device 10 by eliminating static electricity introduced from the outside. In an embodiment, the anti-electrostatic circuit ESD may be disposed in the same layer as the bottom metal layer BML and the gate layer, but embodiments of the present disclosure are not necessarily limited thereto.

While the present disclosure has been particularly shown and described with reference to non-limiting embodiments thereof, it will be understood by those of ordinary skill in the art that various changes in form and detail may be made therein without departing from the spirit and scope of the present disclosure. The described embodiments of the present disclosure should be considered in a descriptive sense only and not for purposes of limitation.

What is claimed is:

1. A display device comprising:

a display area comprising first to third pixels respectively emitting light having different colors from each other, and a display transmissive area located on a side of the first to third pixels; and a first non-display area located on a first side of the display area, wherein the first non-display area comprises:

a scan line area comprising a plurality of lines extending in a first direction and spaced apart from each other in a second direction intersecting the first direction;

a scan circuit disposed between the scan line area and the display area, the scan circuit receiving a signal from the plurality of lines and providing a scan signal to the display area;

an anti-electrostatic element disposed at an outermost portion of the first non-display area; and a non-display transmissive area located between the scan line area and the anti-electrostatic element to transmit light, and wherein an area of the non-display transmissive area in a plan view is greater than an area of the scan circuit in the plan view.

2. The display device of claim 1, wherein the non-display transmissive area does not comprise a metal layer, a transistor, a signal line, or a voltage line.

3. The display device of claim 1, wherein the plurality of lines comprise:

a clock line disposed adjacent to the non-display transmissive area, the clock line providing a clock signal to the scan circuit;

a carry line disposed adjacent to the scan circuit, the carry line providing a carry signal to the scan circuit; and a scan input line disposed between the clock line and the carry line, the scan input line providing a scan input signal to the scan circuit.

4. The display device of claim 1, wherein:

the first to third pixels are adjacent to each other in the first direction; and the display transmissive area is located on a first side of the first to third pixels in the second direction.

5. The display device of claim 1, further comprising:

a low-level voltage line overlapping with the scan circuit and extending in the first direction; and a bridge contact overlapping with the low-level voltage line, wherein each of the first to third pixels comprises a pixel electrode, an emissive layer and a common electrode, and wherein the common electrode extends to the first non-display area beyond the display area and is in direct contact with the low-level voltage line at the bridge contact.

6. The display device of claim 5, further comprising:

a substrate defining the display area and the first non-display area;

a light-emitting element layer disposed on the substrate and comprising a pixel circuit and a light-emitting element of each of the first to third pixels;

an encapsulation layer disposed on the light-emitting element layer;

an opposing substrate facing the substrate;

a color filter layer disposed on a surface of the opposing substrate facing the substrate and comprising first to third color filters associated with the first to third pixels, respectively;

a wavelength conversion layer disposed on a surface of the color filter layer and comprising first to third transparent members associated with the first to third color filters, respectively;

a filling layer disposed between the encapsulation layer and the wavelength conversion layer and filling space therebetween; and a sealing member disposed along an edge of the first non-display area, the sealing member attaching the substrate to the opposing substrate.

7. The display device of claim 6, further comprising:

a compensation layer disposed at an edge of the surface of the opposing substrate and overlapping with the low-level voltage line, the scan line area and the non-display transmissive area.

8. The display device of claim 6, further comprising:

a bank disposed on the surface of the color filter layer, the bank defining the first to third transparent members; and first to third dummy pixels defined by the bank, the first to third dummy pixels overlap with the scan circuit, and have a same shape as the first to third pixels in the plan view.

9. The display device of claim 8, wherein the first to third dummy pixels comprise the first to third color filters and the first to third transparent members, respectively, and do not comprise a light-emitting element.

10. The display device of claim 5, further comprising:

a second non-display area adjacent to the first non-display area;

a third non-display area located at a position opposite to the second non-display area; and a fourth non-display area located at a position opposite to the first non-display area, wherein the low-level voltage line and the anti-electrostatic element are disposed along the first to fourth non-display areas and surround the display area in the plan view and are spaced apart from the display area.

11. An electronic device, comprising:

a display device; and a power supply providing power to the display device, wherein the display device comprises:

a display area comprising a plurality of pixels respectively emitting light having different colors from each other, and a display transmissive area located on a side of the plurality of pixels; and a first non-display area located on a first side of the display area, wherein the first non-display area comprises:

a scan line area comprising a plurality of lines extending in a first direction and spaced apart from each other in a second direction intersecting the first direction;

a scan circuit disposed between the scan line area and the display area, the scan circuit receiving a signal from the plurality of lines and providing a scan signal to the display area;

an anti-electrostatic element disposed at an outermost portion of the first non-display area; and a non-display transmissive area located between the scan line area and the anti-electrostatic element to transmit light, and wherein an area of the non-display transmissive area in a plan view is greater than an area of the scan circuit in the plan view.

* * * * *